US012568681B2

(12) United States Patent
Yang et al.

(10) Patent No.: US 12,568,681 B2
(45) Date of Patent: Mar. 3, 2026

(54) ACTIVE REGION PATTERNING

(71) Applicant: Taiwan Semiconductor Manufacturing Company, Ltd., Hsinchu (TW)

(72) Inventors: Chih-Hsin Yang, Hsinchu (TW); Yen-Ming Chen, Hsin-Chu County (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 795 days.

(21) Appl. No.: 17/363,289

(22) Filed: Jun. 30, 2021

(65) Prior Publication Data

US 2022/0392897 A1 Dec. 8, 2022

Related U.S. Application Data

(60) Provisional application No. 63/195,933, filed on Jun. 2, 2021.

(51) Int. Cl.
| | |
|---|---|
| *H10D 84/83* | (2025.01) |
| *H01L 21/308* | (2006.01) |
| *H10D 62/10* | (2025.01) |

(52) U.S. Cl.
CPC ....... *H10D 84/834* (2025.01); *H01L 21/3081* (2013.01); *H10D 62/126* (2025.01)

(58) Field of Classification Search
CPC ............. H01L 27/0886; H01L 27/0924; H01L 29/785; H01L 29/0692; H01L 21/0274
See application file for complete search history.

(56) References Cited

U.S. PATENT DOCUMENTS

| | | | |
|---|---|---|---|
| 9,190,496 | B2 | 11/2015 | Lin et al. |
| 9,269,627 | B1 * | 2/2016 | Cheng ............... H01L 21/02532 |
| 9,337,099 | B1 * | 5/2016 | Jain ....................... H01L 23/528 |
| 9,779,960 | B2 * | 10/2017 | Xie ..................... H01L 21/3086 |
| 2013/0174103 | A1 | 7/2013 | Shieh et al. |
| 2016/0148808 | A1 | 5/2016 | Kim et al. |
| 2016/0351411 | A1 | 12/2016 | Xie |
| 2020/0075428 | A1 * | 3/2020 | Venigalla ........ H01L 21/823878 |
| 2020/0161198 | A1 | 5/2020 | Park et al. |
| 2020/0365587 | A1 | 11/2020 | Kwon |
| 2022/0157722 | A1 * | 5/2022 | Bouche ............... H01L 29/0673 |

FOREIGN PATENT DOCUMENTS

| | | |
|---|---|---|
| TW | 201501294 A | 1/2015 |

* cited by examiner

*Primary Examiner* — Chad M Dicke
*Assistant Examiner* — Valerie N Newton
(74) *Attorney, Agent, or Firm* — HAYNES AND BOONE, LLP

(57) ABSTRACT

Semiconductor structures and fabrication processes are provided. A semiconductor according to the present disclosure includes a first region including a first fin, a second fin, and a third fin extending along a first direction, and a second region abutting the first region. The second region includes a fourth fin and a fifth fin extending along the first direction. The first fin is aligned with the fourth fin and the second fin is aligned with the fifth fin. The third fin terminates at an interface between the first region and the second region.

20 Claims, 22 Drawing Sheets

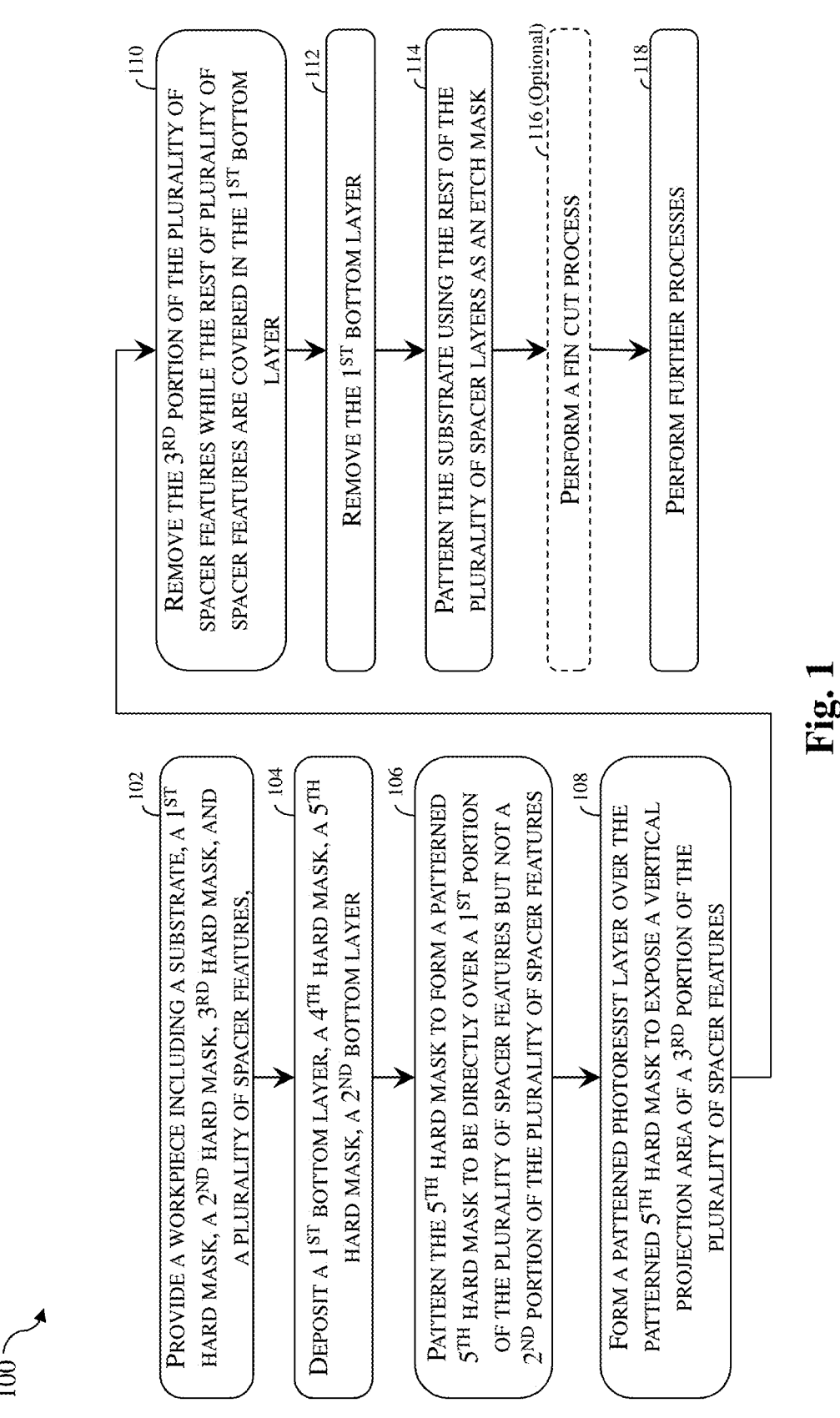

100

PROVIDE A WORKPIECE INCLUDING A SUBSTRATE, A $1^{ST}$ HARD MASK, A $2^{ND}$ HARD MASK, $3^{RD}$ HARD MASK, AND A PLURALITY OF SPACER FEATURES, — 102

DEPOSIT A $1^{ST}$ BOTTOM LAYER, A $4^{TH}$ HARD MASK, A $5^{TH}$ HARD MASK, A $2^{ND}$ BOTTOM LAYER — 104

PATTERN THE $5^{TH}$ HARD MASK TO FORM A PATTERNED $5^{TH}$ HARD MASK TO BE DIRECTLY OVER A $1^{ST}$ PORTION OF THE PLURALITY OF SPACER FEATURES BUT NOT A $2^{ND}$ PORTION OF THE PLURALITY OF SPACER FEATURES — 106

FORM A PATTERNED PHOTORESIST LAYER OVER THE PATTERNED $5^{TH}$ HARD MASK TO EXPOSE A VERTICAL PROJECTION AREA OF A $3^{RD}$ PORTION OF THE PLURALITY OF SPACER FEATURES — 108

REMOVE THE $3^{RD}$ PORTION OF THE PLURALITY OF SPACER FEATURES WHILE THE REST OF PLURALITY OF SPACER FEATURES ARE COVERED IN THE $1^{ST}$ BOTTOM LAYER — 110

REMOVE THE $1^{ST}$ BOTTOM LAYER — 112

PATTERN THE SUBSTRATE USING THE REST OF THE PLURALITY OF SPACER LAYERS AS AN ETCH MASK — 114

PERFORM A FIN CUT PROCESS — 116 (Optional)

PERFORM FURTHER PROCESSES — 118

Fig. 1

ACTIVE REGION PATTERNING

PRIORITY DATA

This application claims priority to U.S. Provisional Patent Application Ser. No. 63/195,933, filed Jun. 2, 2021, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-type field effect transistors (FinFETs) is an example of multi-gate devices that has become a popular and promising candidate for high performance and low leakage applications. A FinFET has an elevated channel wrapped by a gate on more than one side (for example, the gate wraps a top and sidewalls of a "fin" of semiconductor material extending from a substrate).

As its name suggests, an active region of a FinFET resembles a fin and is formed from a semiconductor substrate or semiconductor layer formed on a substrate. During the formation of fins, some of the fins may be removed or cut to fit various design needs. While existing active region formation processes are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 illustrates a flow chart of a method for forming a semiconductor structure having a plurality of semiconductor fins, according to one or more aspects of the present disclosure.

DETAILED DESCRIPTION

Figure 2:
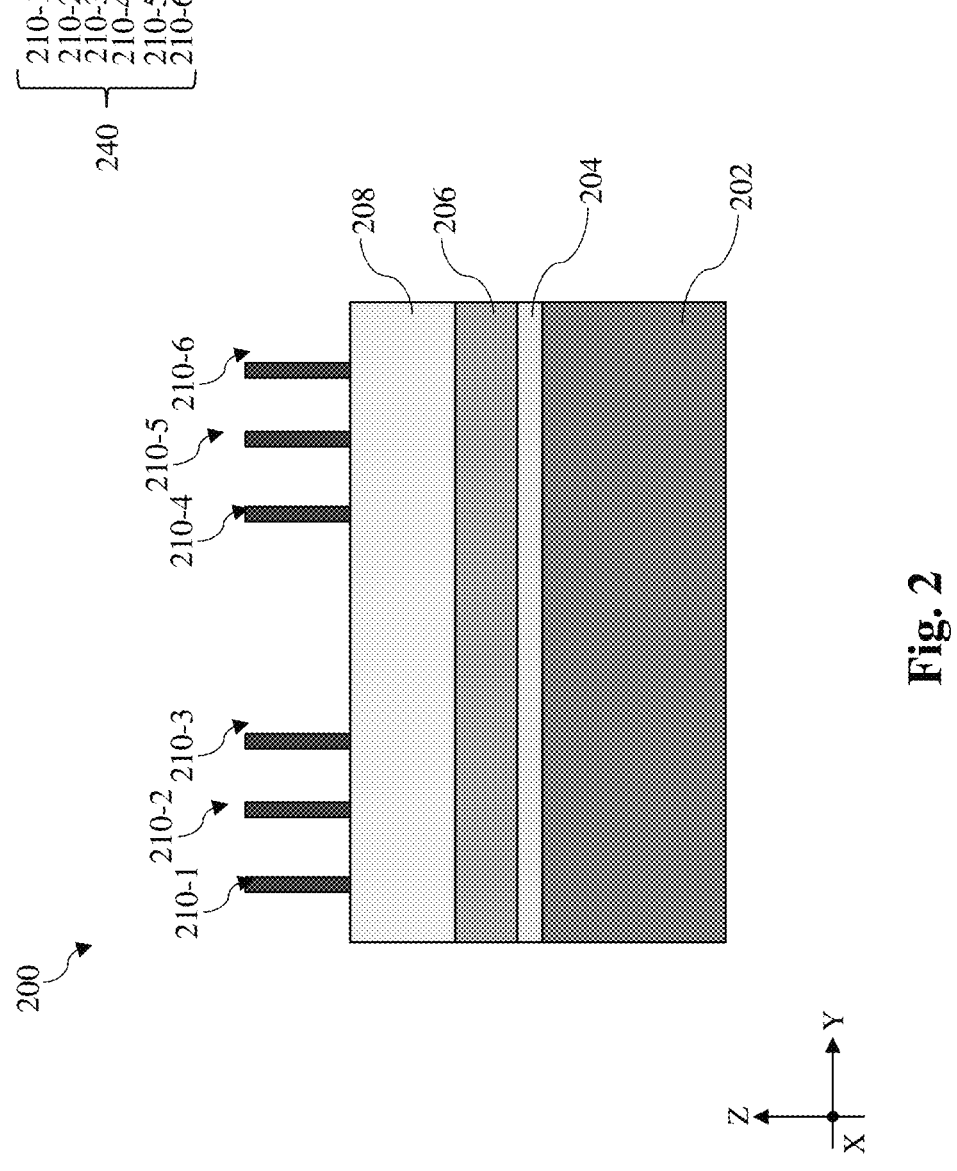
FIGS. 2-22 illustrate fragmentary cross-sectional views or top views of a workpiece during a fabrication process according to the method of FIG. 1, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/-10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/-15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Still further, example embodiments are described herein with reference to various fragmentary cross-sectional or top-view illustrations that are schematic and/or idealized. As such, variations from the shapes of the illustration as a result of fabrication tolerances are to be expected. Unless explicitly specified herein, shapes in the illustrations may not be intended to illustrate the actual shapes and should not limit the scope of the present disclosure. Additionally, unless otherwise defined, all terms used herein have the same meanings as commonly understood by one of ordinary skill in the art to which the example embodiments belong.

A FinFET may include one or more fin-elements to suit different design needs. For instance, the number of fin elements in a FinFET may determine the drive current, speed and leakage current thereof. In general, a FinFET with a greater number of fin elements has a greater drive current, a faster speed, and a greater leakage current. Conversely, a FinFET with a smaller number of fin elements has a smaller drive current, a slower speed, and a smaller leakage current. In some existing technologies, a group of adjacent fin elements may receive one transverse cut and one longitudinal cut after their formation. The former reduces the lengths of the fin elements while the latter reduces the number of fin elements. The transverse cut may also be referred to as a fine cut and the longitudinal cut may also be referred to as a coarse cut. The transverse cut and the longitudinal cut are usually in a unidirectional elongated shape. As the transverse cut and the longitudinal cut are perpendicular to one another and elongated, they result in a multi-fin device region that is rectangular and includes the same number of fin elements throughout its length, such as two fin elements, three fin elements, or four fin elements. In some instances, device regions with different number of fin elements may even be disposed in two different wafers. In these existing technologies, when a circuit design calls for both low leakage transistors with fewer number of fin elements and high speed transistors with greater number of fin elements, the two types of transistors have to be formed in different active regions that are spaced apart far from one another, reducing design flexibility or increasing routing.

The present disclosure provides methods to form a non-rectangular active region having more than one sub-regions that include different number of fin elements. For example, the non-rectangular active region may include one sub-region having 3 fin elements and another sub-region having 2 fin elements. The non-rectangular active region allows more design flexibility because a high speed/high drive current 3-fin transistor may be placed near a low consumption/low leakage two-fin transistor. Unlike the existing technologies, methods of the present disclosure use a patterned hard mask and a patterned photoresist layer as an etch mask in forming the active region. The formation of the patterned photoresist layer includes use of two-directional exposure pattern.

The various aspects of the present disclosure will now be described in more detail with reference to the figures. In that regard, FIG. 1 is a flowchart illustrating a method 100 of forming a semiconductor structure according to embodiments of the present disclosure. Method 100 is merely an example and is not intended to limit the present disclosure to what is explicitly illustrated in method 100. Additional steps may be provided before, during and after method 100, and some steps described can be replaced, eliminated, or moved around for additional embodiments of the method. Not all steps are described herein in detail for reasons of simplicity. Method 100 is described below in conjunction with FIGS. 2-22, which are fragmentary cross-sectional views or top views of a workpiece 200 at different stages of fabrication according to method 100. Because the workpiece 200 will be fabricated into a semiconductor device or a semiconductor structure upon conclusion of the fabrication processes, the workpiece 200 may also be referred to as the semiconductor device 200 or a semiconductor structure 200 as the context requires. Additionally, throughout the present application, like reference numerals denote like features, unless otherwise excepted. Furthermore, while semiconductor structures illustrated in the figures may have two to three fin elements, the present disclosure is not so limited and may be applicable to semiconductor device having transistors with more than three fin elements or transistor with less than two fin elements.

Figure 3:
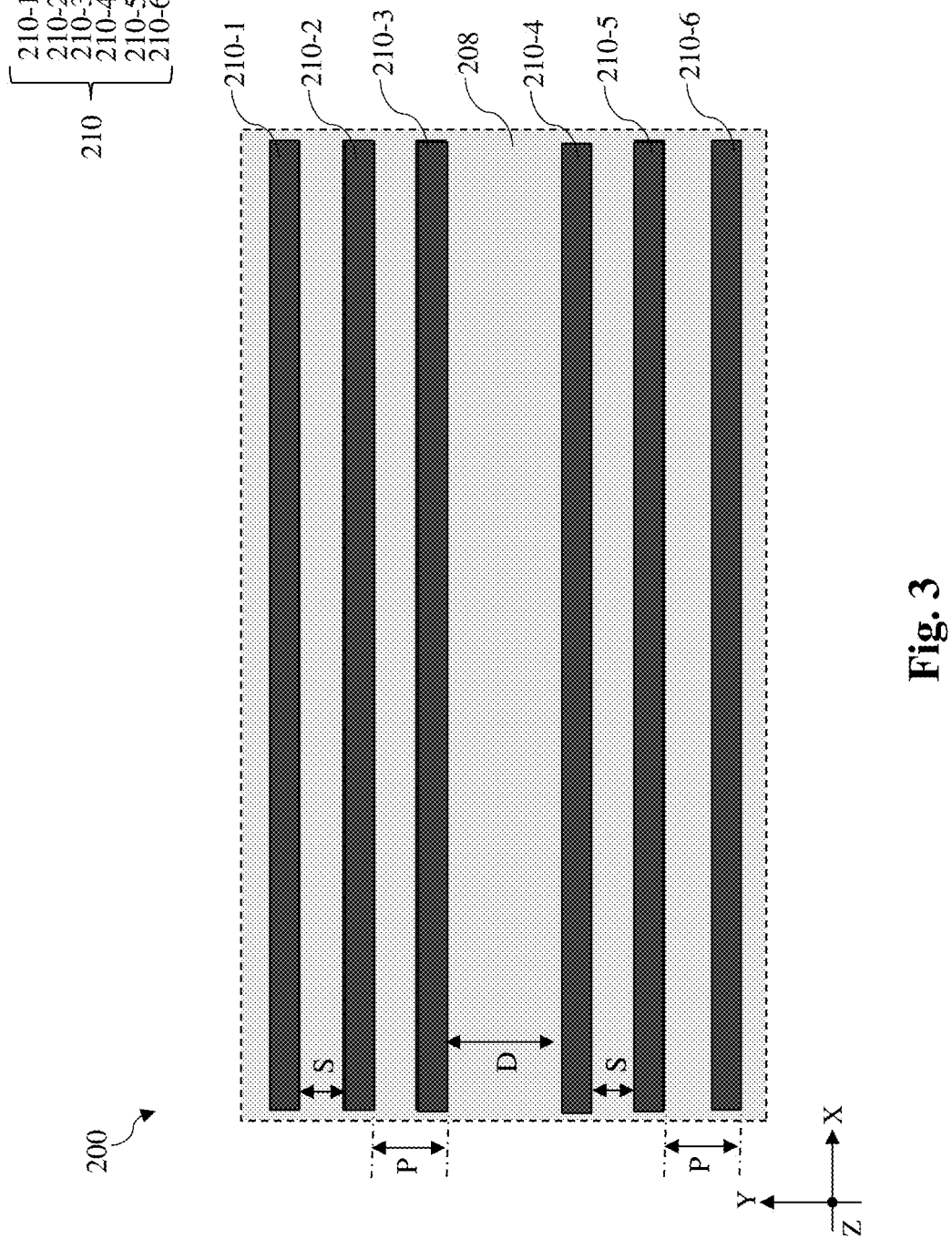

Referring to FIGS. 1, 2 and 3, method 100 includes a block 102 where a workpiece 200 is provided. FIG. 2 includes a fragmentary cross-sectional view of the workpiece 200 while FIG. 3 illustrates a fragmentary top view of the workpiece 200. As shown in FIG. 2, the workpiece 200 includes a substrate 202, a first hard mask 204, a second hard mask 206, a third hard mask 208, and a plurality of spacer features 210. The substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure. The first hard mask 204 may include silicon oxide and may be formed using a thermal oxidation process. The second hard mask 206 may include a dielectric material different from that of the first hard mask 204. In some embodiments, the second hard mask 206 may include silicon nitride. The second hard mask 206 may be formed using atomic layer deposition (ALD) or chemical vapor deposition (CVD). The third hard mask 208 may include silicon oxide and may be formed using ALD or CVD. In some instances, the first hard mask 204 may have a thickness between about 15 Å and 35 Å; the second hard mask 206 may have a thickness between about 200 Å and about 300 Å; and the third hard mask 208 may have a thickness between about 300 Å and about 700 Å.

As shown in FIG. 2, the workpiece 200 may also include a plurality of spacer features 210. The plurality of spacer features 210 may be intermediate structures formed during a double-patterning or a multi-patterning process. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process to form sacrificial mandrels. A spacer material layer is then conformally deposited over the sacrificial mandrels. After the deposited spacer material layer is etched back, the spacer material layer remains along sidewalls of the sacrificial mandrels. The sacrificial mandrels are then removed, leaving behind the plurality of spacer features 210. In some embodiments, the plurality of spacer features 210 may include silicon nitride.

Reference is now made to FIGS. 2 and 3. The plurality of spacer features 210 include two groups of spacer features. A first group includes a first spacer feature 210-1, a second spacer feature 210-2, and a third spacer feature 210-3. A second group includes a fourth spacer feature 210-4, a fifth spacer feature 210-5, and a sixth spacer feature 210-6. The first group and the second group are characterized by the same pitch P and spacing S. However, the first group and the second group are spaced apart from one another by a distance D that is at least 4 times of the spacing S. It is noted that while the first group and second group each includes three spacer features, they are merely examples. The present disclosure may be applied to workpieces that include groups of spacer features that include more than 3 spacer features each.

Figure 4:
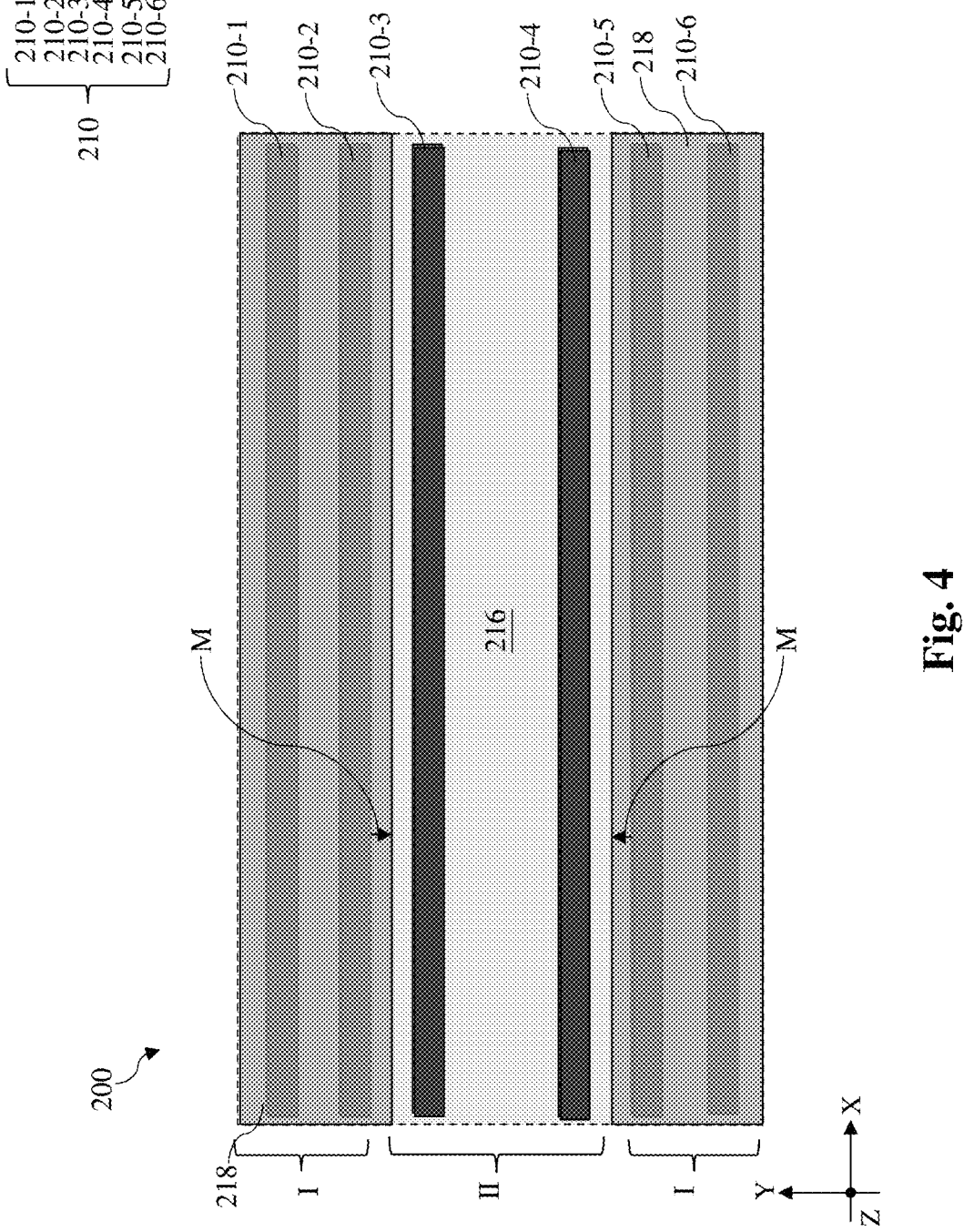
Figure 5:
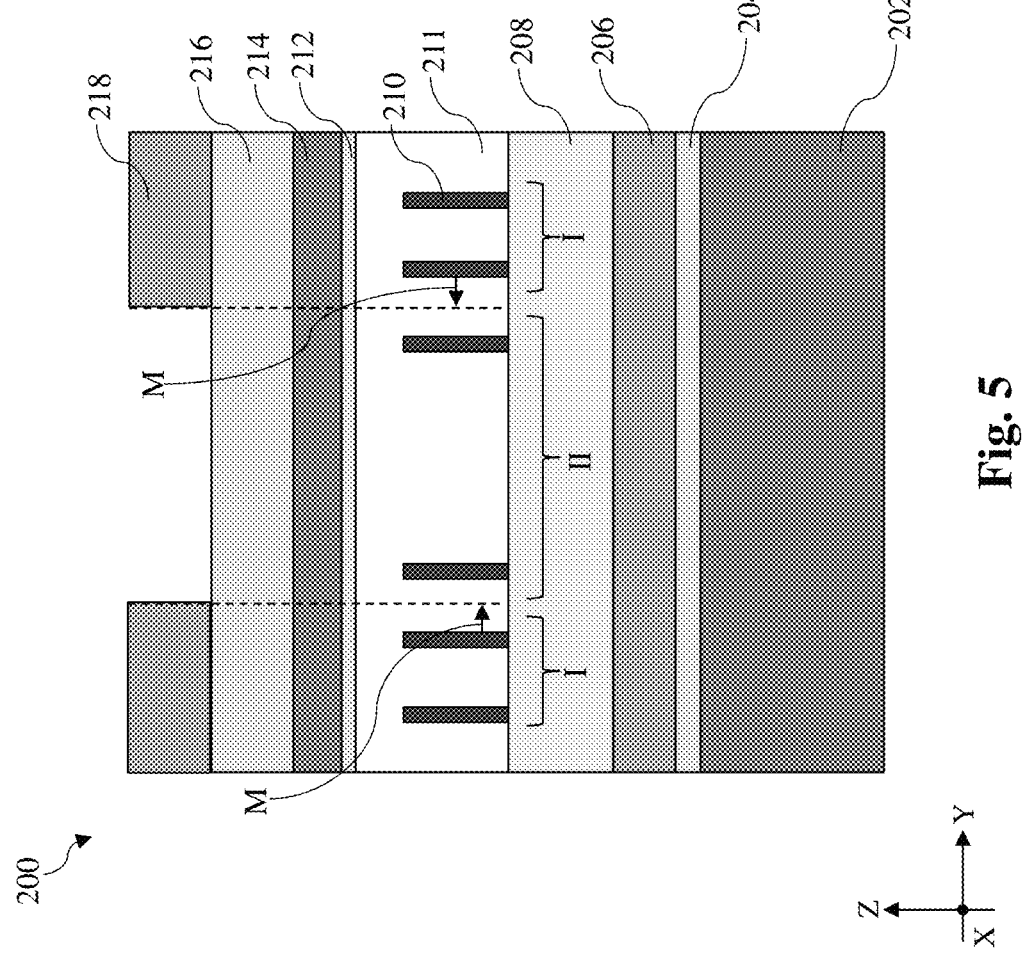

Referring to FIGS. 1, 4 and 5, method 100 includes a block 104 where a first bottom layer 211, a fourth hard mask 212, and a fifth hard mask 214, and a second bottom layer 216 are deposited over the workpiece 200. FIG. 4 includes a fragmentary top view of the workpiece 200 and FIG. 5 illustrates a fragmentary cross-sectional view of the workpiece 200 along the Y direction. In some embodiments, the first bottom layer 211 may be a carbon-containing layer and may include silicon carbide (SiC), silicon oxycarbide (SiOC), or spin-on carbon (SOC). In some other embodiments, the first bottom layer 211 may be a bottom antireflective coating (BARC) and may include a silicon containing polymer, such as polysilazane resin. The second bottom layer 216 may be different from the first bottom layer 211. In some implementations, the second bottom layer 216 may include silicon carbide (SiC), silicon oxycarbide (SiOC), or spin-on carbon (SOC). The fourth hard mask 212 may include silicon oxide or silicon oxycarbonitride. The fifth hard mask 214 may include silicon or silicon nitride. In an example process, the first bottom layer 211 is deposited over the workpiece 200 using flowable CVD (FCVD), CVD, or spin-on coating. The fourth hard mask 212 is then deposited on the first bottom layer 211 by CVD. The fifth hard mask 214 is deposited on the fourth hard mask 212 by CVD. Thereafter, a second bottom layer 216 is deposited over the fifth hard mask 214 using flowable CVD (FCVD) or spin-on coating.

Figure 6:
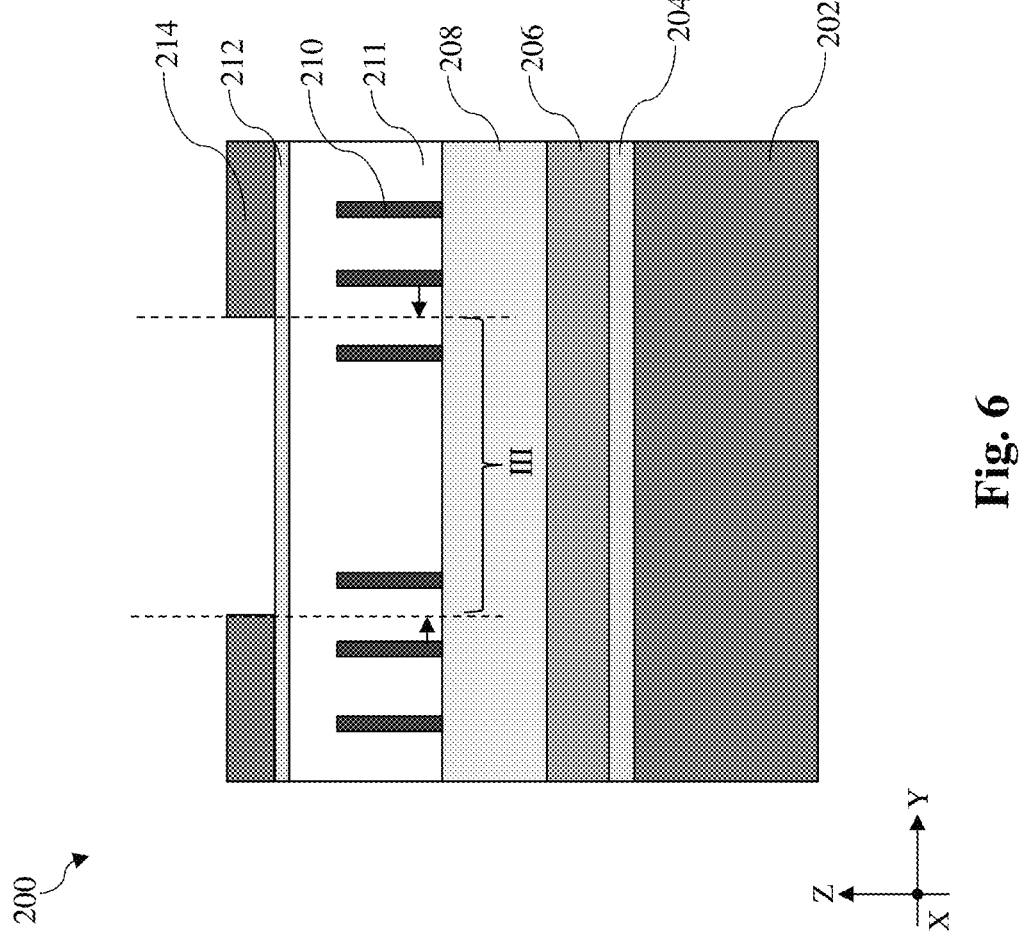

Referring to FIGS. 1 and 4-6, method 100 includes a block 106 where the fifth hard mask 214 is patterned to form a patterned fifth hard mask 214 to be disposed directly over a first portion I of the plurality of spacer features 210 but not a second portion II of the plurality of spacer features 210. Operations at block 106 may include forming a patterned first photoresist layer 218 over the second bottom layer 216 (shown in FIGS. 4 and 5) and etching the fifth hard mask 214 using the patterned first photoresist layer 218 as an etch mask (shown in FIG. 6). At block 106, the fifth hard mask 214 may be patterned using photolithography and etch processes. In an example process, the first photoresist layer 218 is deposited on the second bottom layer 216. The first photoresist layer 218 is exposed to a unidirectional patterned radiation (along the X direction) reflected from or transmitting through a photomask, developed in a developer solution, and baked in a bake process, so as to form a patterned first photoresist layer 218. For ease of reference, the first photoresist layer is identified using reference numeral 218 before and after the patterning. As shown in FIGS. 4 and 5, the patterned first photoresist layer 218 is elongated along the spacer feature length direction (X direction) and disposed directly over a first portion I of the plurality of spacer features 210 but not directly over a second portion II of the plurality of spacer features 210. In the depicted implementations, each of the first portion I includes two spacer features. To ensure sufficient coverage of the spacer features in the first portion, a long-side edge of the patterned first photoresist layer 218 overhangs the outermost to-be-covered spacer feature by a margin M. The margin M may be around one half (0.5) of the spacing S shown in FIG. 3, such as between about 0.4 times of S and about 0.6 times of S. Referring now to FIG. 6, the patterned first photoresist layer 218 may then be used as an etch mask in a dry etch process to pattern the fifth hard mask 214, thereby forming the patterned fifth hard mask 214. The patterned fifth hard mask 214 may have substantially identical vertical coverage as the patterned first photoresist layer 218. That is, the patterned fifth hard mask 214 may overhang the outermost spacer feature by the margin M as well. An example dry etch process at block 106 may be a reactive-ion-etching (RIE) process that uses nitrogen, a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 6, the patterned fifth hard mask 214 is also disposed directly over the first portion I of the plurality of spacer features 210 but not directly over the second portion II of the plurality of spacer features 210.

Figure 7:
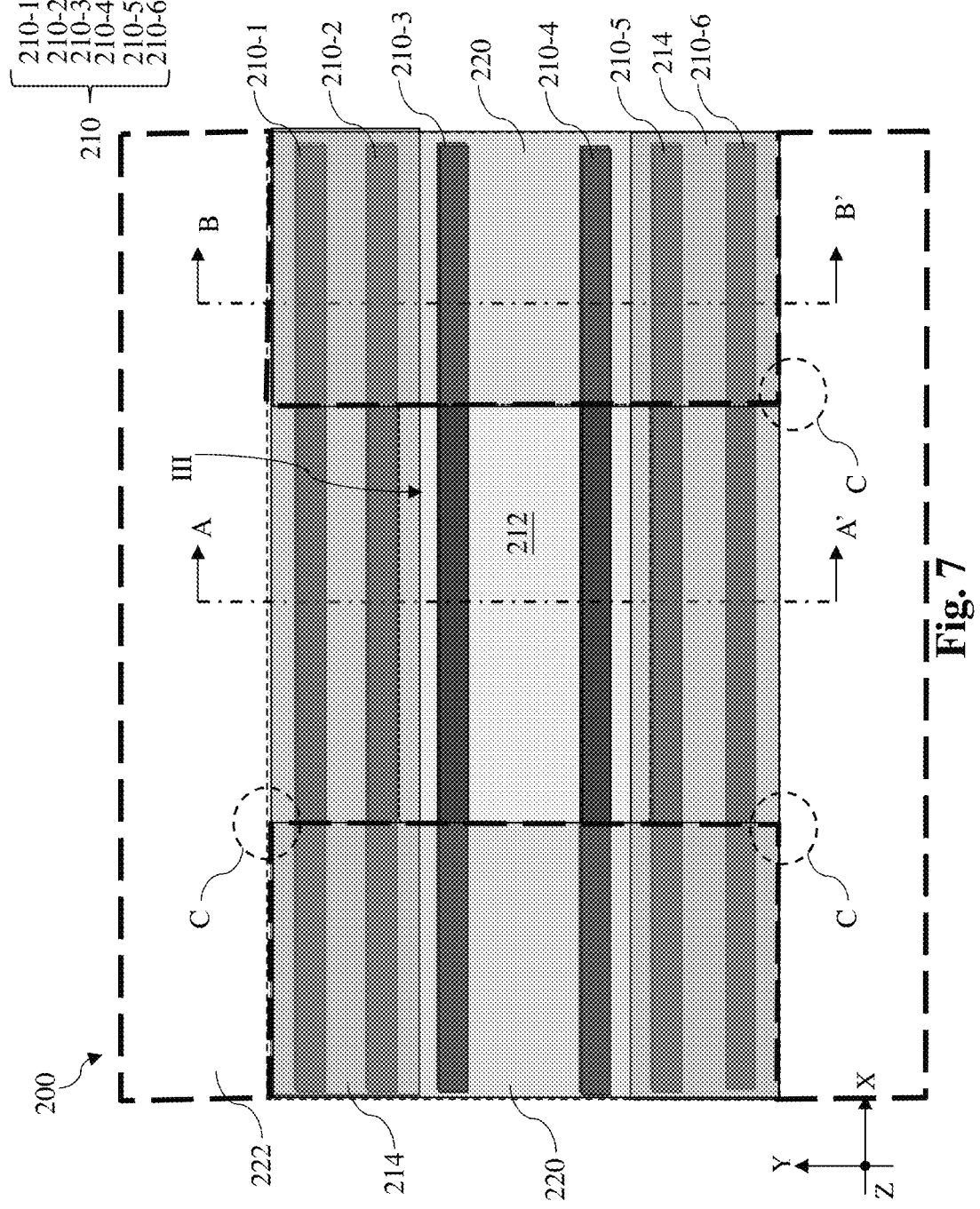
Figure 8:
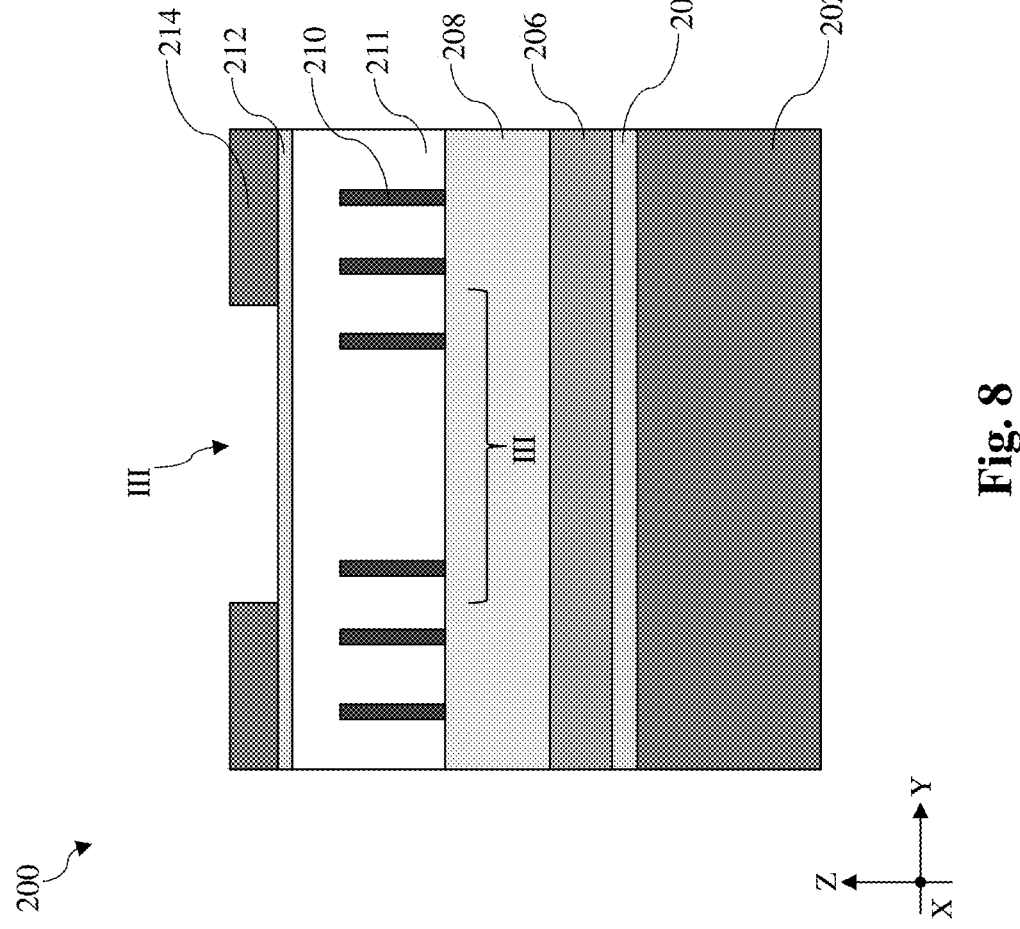
Figure 9:
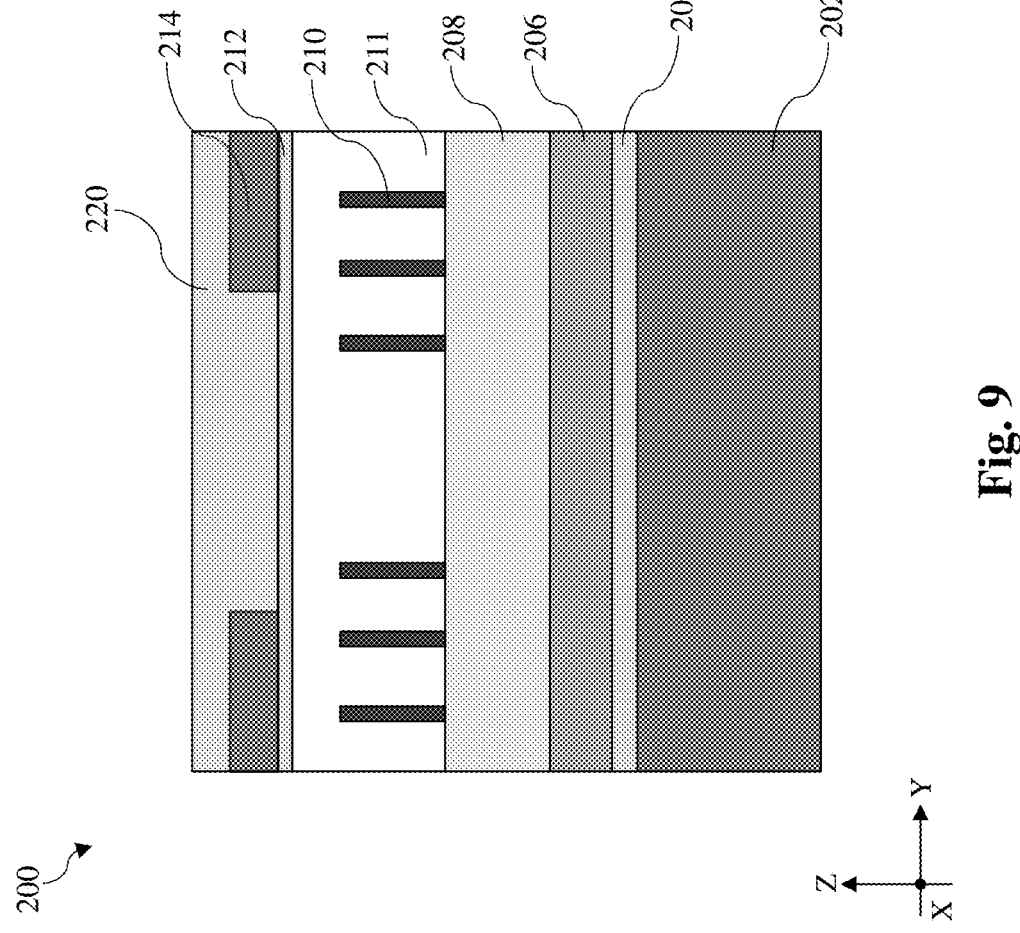

Referring to FIGS. 1 and 7-9, method 100 includes a block 108 where a patterned second photoresist layer 220 is formed over the patterned fifth hard mask 214 to expose a vertical projection area of a third portion III of the plurality of spacer features 210. FIG. 7 includes a fragmentary top view of the workpiece 200 after the patterned second photoresist layer 220 is formed. FIG. 8 illustrates a cross-sectional view of the workpiece 200 along line A-A'. FIG. 9 illustrates a cross-sectional view of the workpiece 200 along line B-B'. As shown in FIGS. 7 and 8, the patterned second photoresist layer 220 extends lengthwise along the Y direction to intersect the patterned fifth hard mask 214, thereby defining a third portion III of the plurality of spacer features 210. It is noted that the third portion III falls within the second portion II whose X-direction span is truncated by the patterned second photoresist layer 220. As shown in FIGS. 7 and 8, the third portion III is substantially rectangular in shape and is directly over a portion of the third spacer feature 210-3 and a portion of the fourth spacer feature 210-4.

It is noted that the patterned fifth hard mask 214 and the patterned second photoresist layer 220 collectively define the third portion III. Particularly, the Y-direction boundaries of the third portion III are defined by the patterned fifth hard mask 214 and the X-direction boundaries of the third portion III are defined by the patterned second photoresist layer 220. Method 100 includes patterning the second photoresist layer 220 using an exposure pattern 222, which represents the area of the second photoresist layer 220 exposed at the exposure step of the lithography process. Unlike existing practice of lithography patterning, the exposure pattern 222 is two-directional, meaning that the exposure pattern 222 includes components extending along the X direction as well as components extending along the Y direction. While this two-directional exposure pattern 222 tend to result in defects around the corners C, those corners C do not in any way define the third portion III. That way, method 100 reaps the benefit of the two-directional exposure pattern 222 without suffering the negative consequences.

Figure 10:
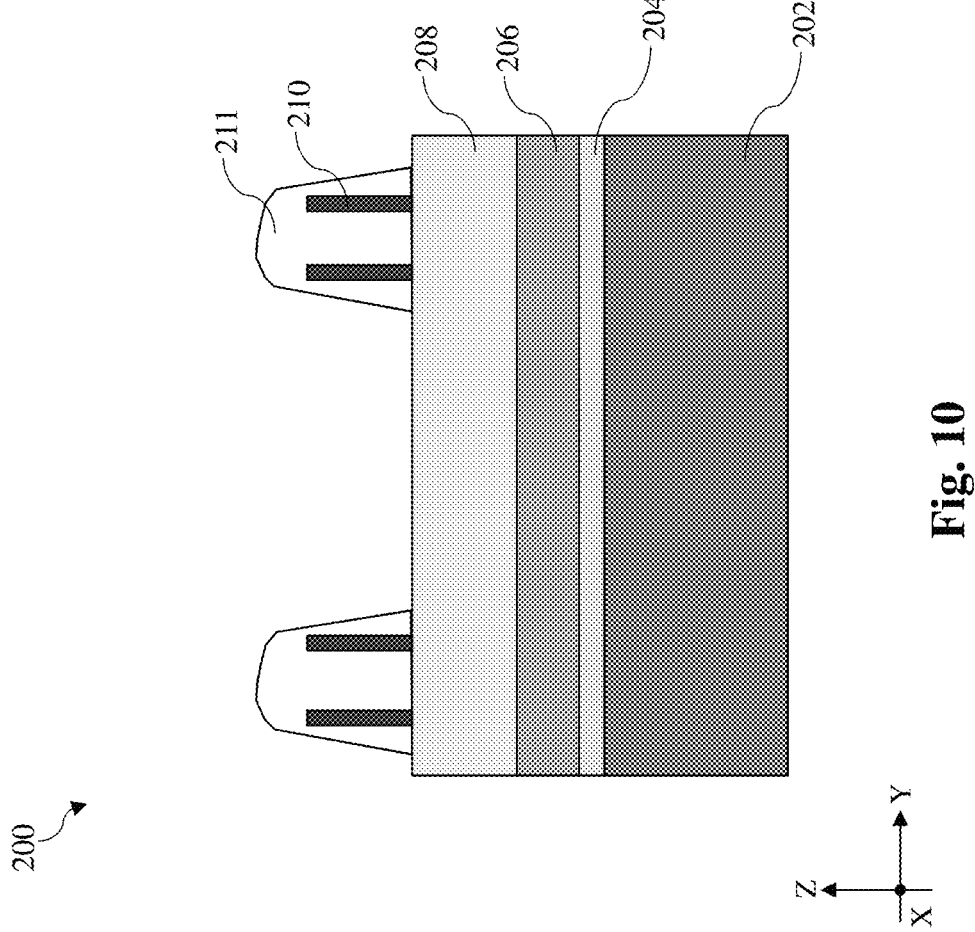
Figure 11:
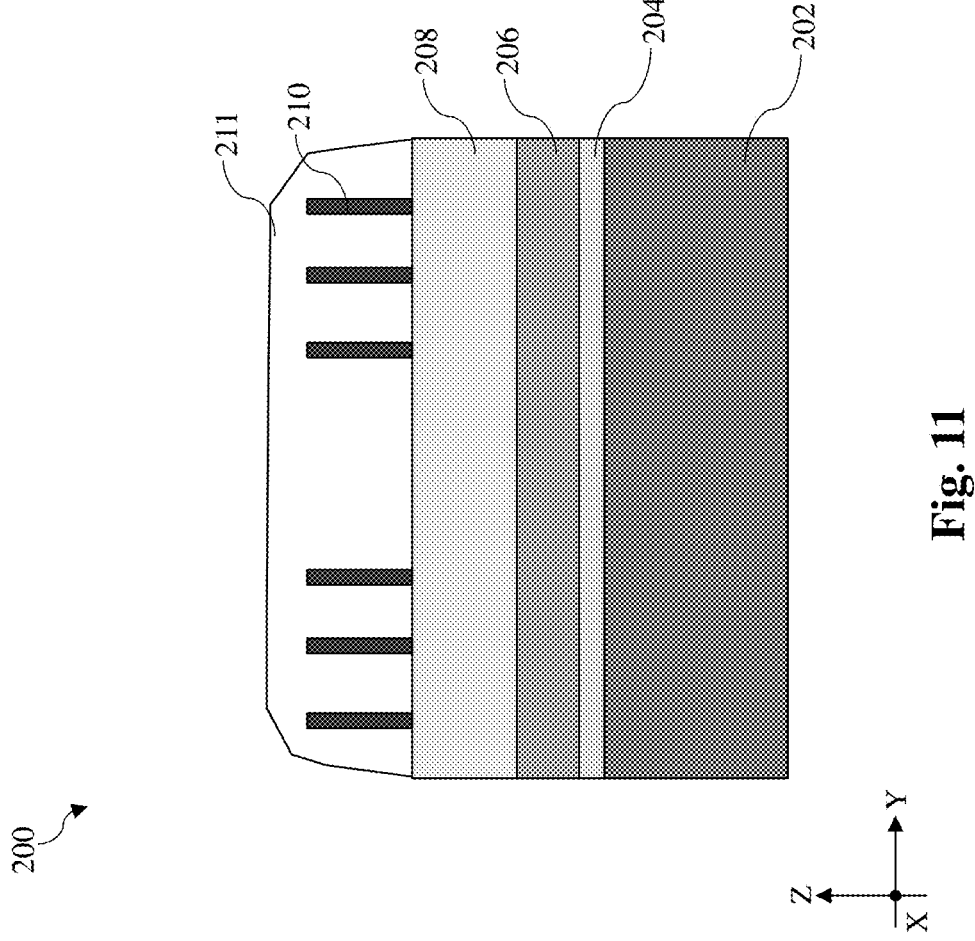

Referring to FIGS. 1, and 10-11, method 100 includes a block 110 where the third portion III (shown in FIG. 8) of the plurality of spacer features 210 are removed while the rest of the plurality of spacer features 210 are embedded in the first bottom layer 211. At block 110, the patterned fifth hard mask 214 and the patterned second photoresist layer 220 are applied as an etch mask to etch the first bottom layer 211 and the spacer features 210. As a result, the portion of the first bottom layer 211 and the portions of the third spacer feature 210-3 and the fourth spacer feature 210-4 not covered by the patterned fifth hard mask 214 and the patterned second photoresist 220 are etched away at block 110. Referring to FIG. 10, because the spacer features in the third portion III of the plurality of spacer features 210 are removed, the workpiece 200 includes two two-fin active regions along line A-A'. Referring to FIG. 11, because the plurality of spacer features 210 are protected by the patterned fifth hard mask 214 and the patterned second photoresist layer 220 along line B-B', the workpiece 200 includes two three-fin active regions along line B-B'. The portion of the spacer features 210 that are not removed at block 110 are embedded in the patterned first bottom layer 211.

Figure 12:
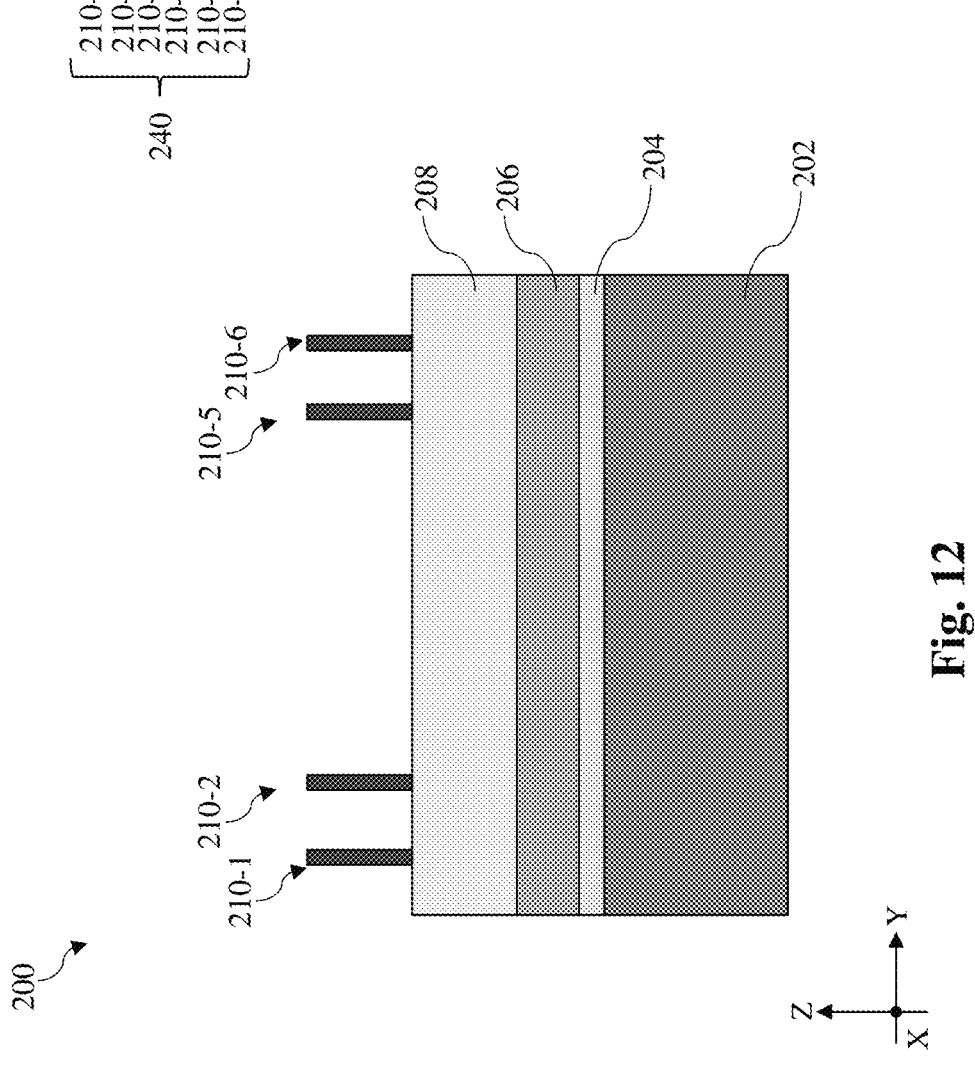
Figure 13:
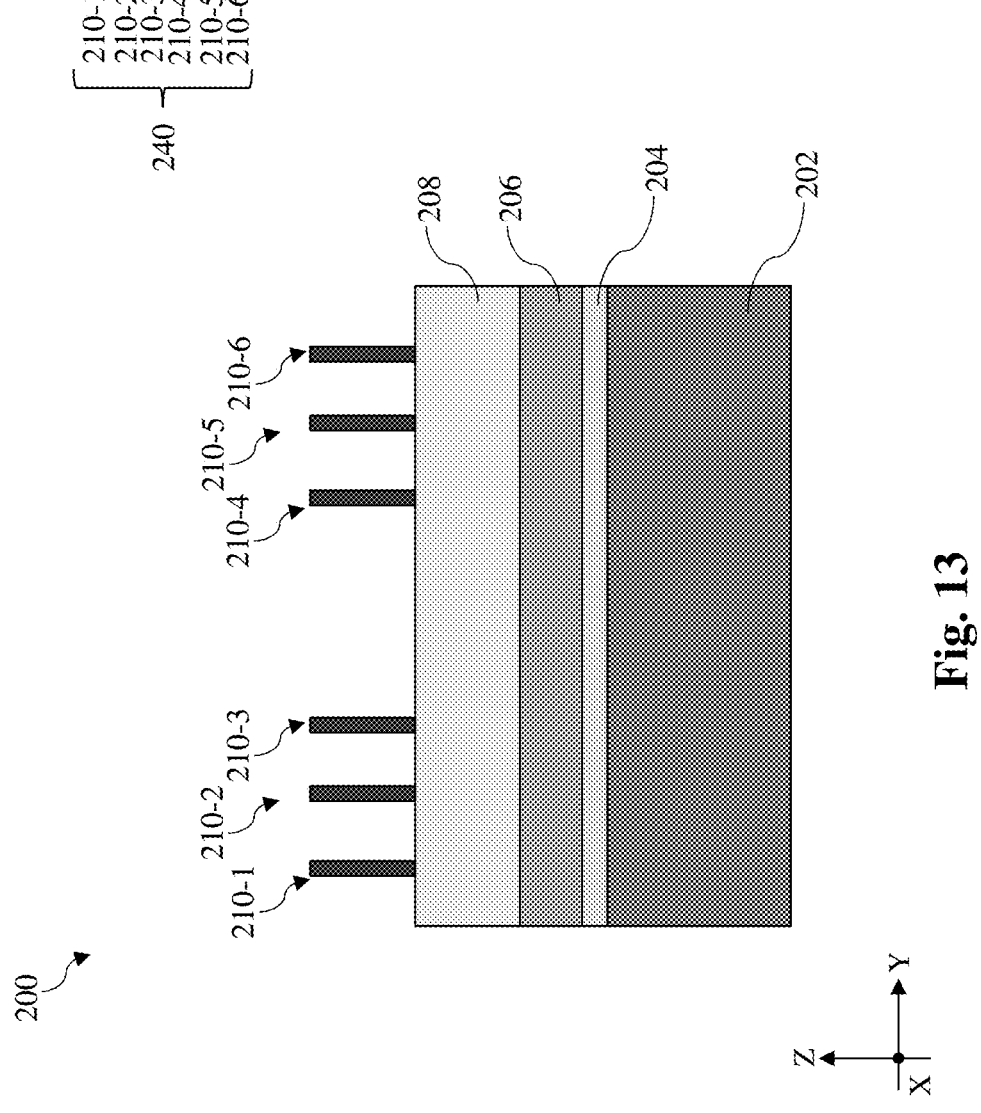

Referring to FIGS. 1, 12 and 13, method 100 includes a block 112 where the first bottom layer 211 is removed. At block 112, the first bottom layer 211 may be selectively removed using a selective wet clean process or a selective dry etch process. An example selective wet clean process may include use of sulfuric acid, hydrogen peroxide, or a combination thereof. An example selective dry etch process may include use of oxygen ($O_2$) and sulfur dioxide ($SO_2$). FIG. 12 illustrates a cross-sectional view along line A-A' while FIG. 13 illustrates a cross-sectional view along line B-B' after the removal of the first bottom layer 211. Because etch process at block 112 is selective to the first bottom layer 211, the third hard mask 208 and the spacer features 210 are substantially intact after the removal of the first bottom layer 211.

Figure 14:
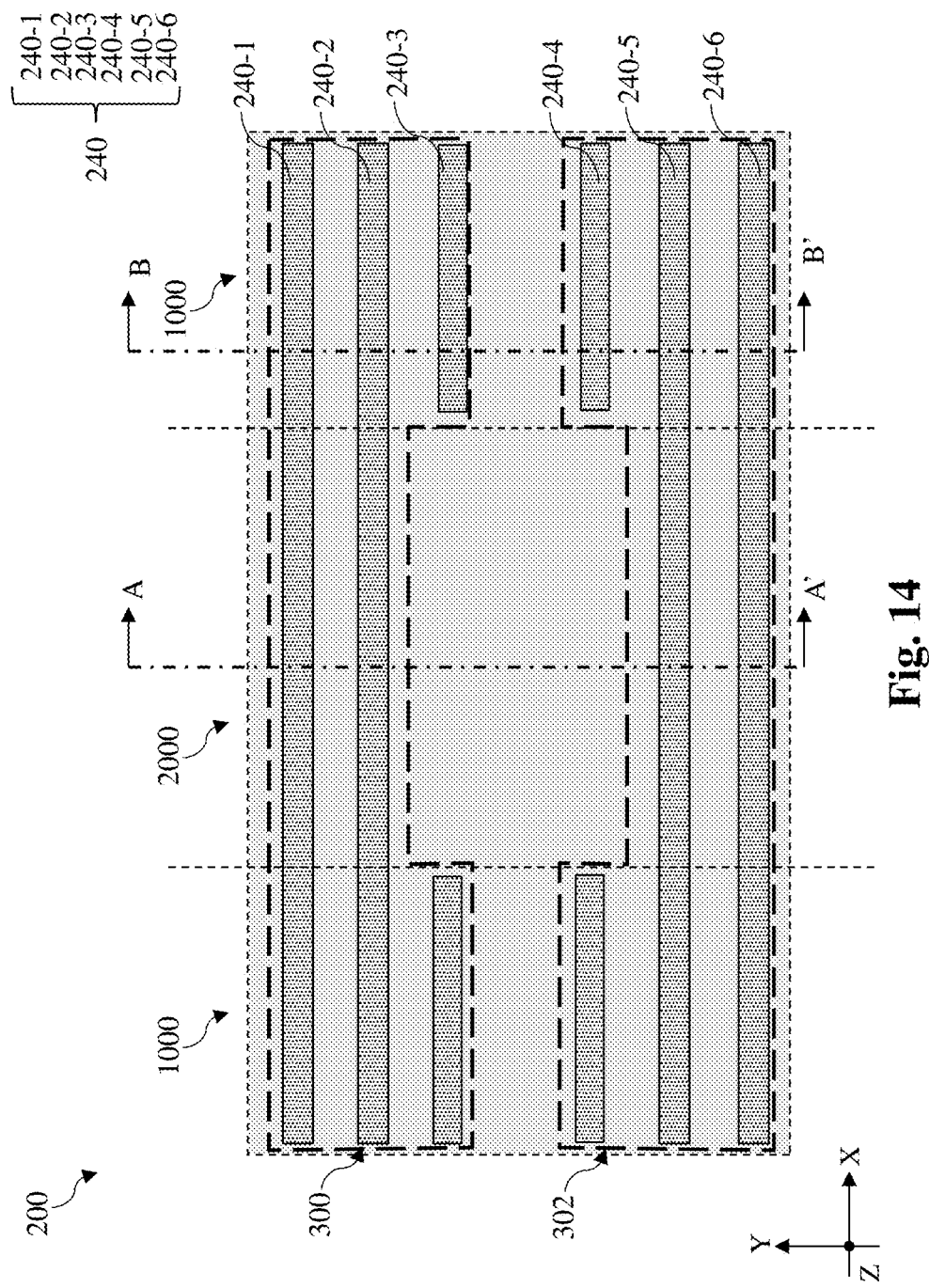
Figure 15:
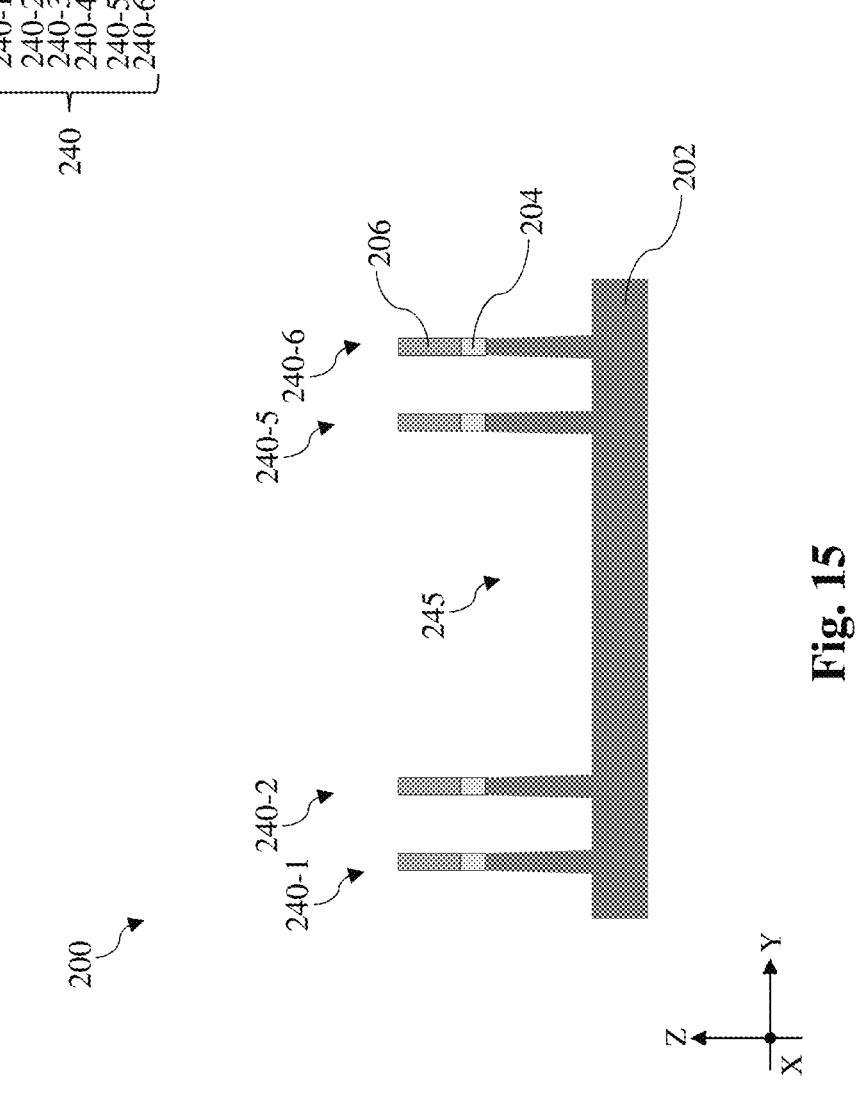
Figure 16:
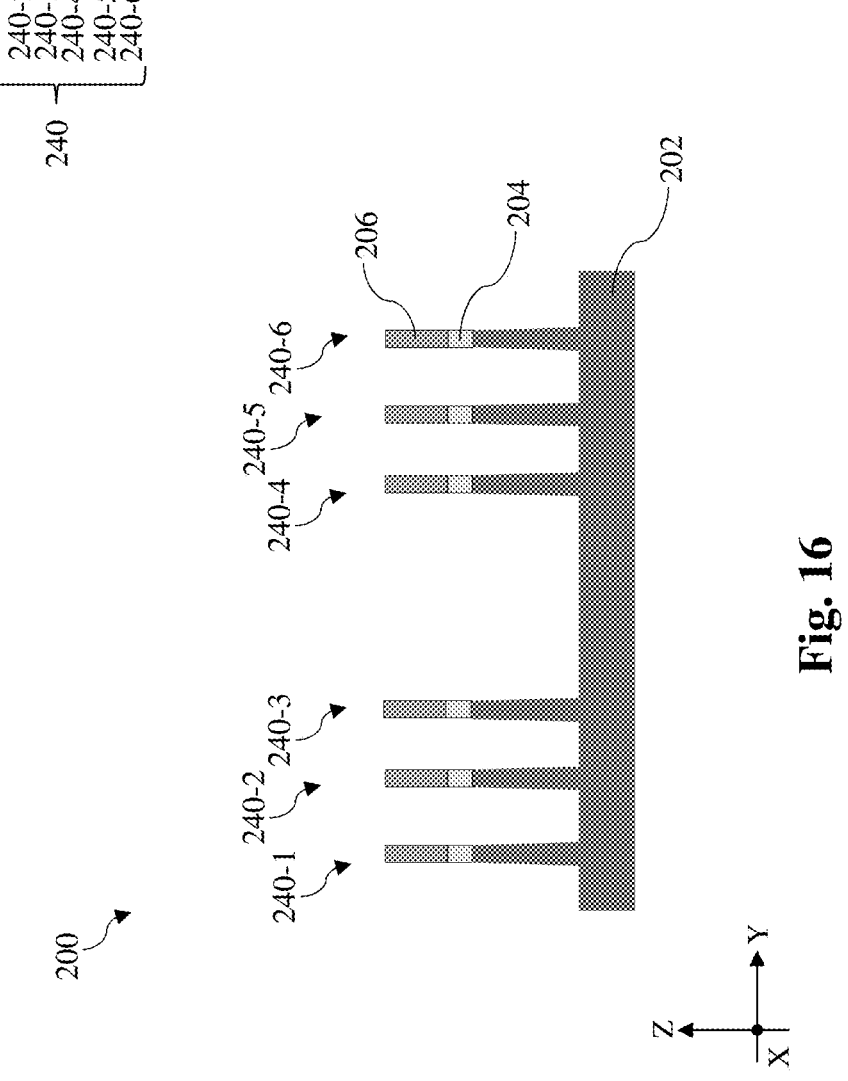

Referring to FIGS. 1 and 14-16, method 100 includes a block 114 where the substrate 202 is patterned using the rest of the plurality of spacer features 210 as an etch mask. FIG. 14 illustrates a fragmentary top view of the workpiece 200 after operations at block 114. FIG. 15 includes a fragmentary cross-sectional view along line A-A' shown in FIG. 14. FIG. 16 includes a fragmentary cross-sectional view along line B-B' shown in FIG. 14. At block 114, the substrate 202 is patterned to form fin elements 240. In the depicted embodiment, the fin elements 240 include a first fin element 240-1, a second fin element 240-2, a third fin element 240-3, a fourth fin element 240-4, a fifth fin element 240-5, and a sixth fin element 240-6. The first fin element 240-1 corresponds to the first spacer feature 210-1, the second fin element 240-2 corresponds to the second spacer feature 210-2, the third fin element 240-3 corresponds to the third spacer feature 210-3, the fourth fin element 240-4 corresponds to the fourth spacer feature 210-4, the fifth fin element 240-5 corresponds to the fifth spacer feature 210-5, and the sixth fin element 240-6 corresponds to the sixth spacer feature 210-6. In this regard, the spacer features may be referred to as precursors of the corresponding fin elements. At block 114, an anisotropic etch process may be used to pattern the substrate 202. In some embodiments, the anisotropic etch may be performed using an RIE process that uses hydrogen, a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Referring to FIG. 14, because of the patterned fifth hard mask 214 and the patterned second photoresist layer 220, block 114 forms a first non-rectangular device region 300 and a second non-rectangular device region 302. Each of the first non-rectangular device region 300 and the second non-rectangular device region 302 includes two three-fin active regions 1000 that sandwich a two-fin active region 2000. Because of the formation process described above, the first non-rectangular device region 300 is a mirror image of the second non-rectangular device region 302 with respect to a center line between the first non-rectangular device region 300 and the second non-rectangular device region 302. As shown in FIG. 14, the third fin element 240-3 and the fourth fin element 240-4 do not extend a whole length along the X direction. Middle portions of the third fin element 240-3 and the fourth fin element 240-4 are not formed at all due to lack to the corresponding spacer features 210. FIG. 15 illustrates a cross-sectional view of the workpiece 200 along line A-A' in FIG. 14. Because line A-A' cuts across the two-fin active region 2000, FIG. 14 shows two two-fin element groups-one including the first fin element 240-1 and the second fin element 240-2 and the other including the fifth fin element 240-5 and the sixth fin element 240-6. The two fin element groups are divided by a field region 245. Because the field region 245 is not formed by etching away fin elements that are already formed, the field region 245 is substantially flat without any fin residue (i.e., residues of removed fins). FIG. 16 illustrates a cross-sectional view of the workpiece 200 along line B-B' in FIG. 14. Because line B-B' cuts across the three-fin active region 1000, FIG. 16 shows two three-fin element groups-one including the first fin element 240-1, the second fin element 240-2, and the third fin element 240-3 and the other including the fourth fin element 240-4, the fifth fin element 240-5 and the sixth fin element 240-6.

Figure 17:
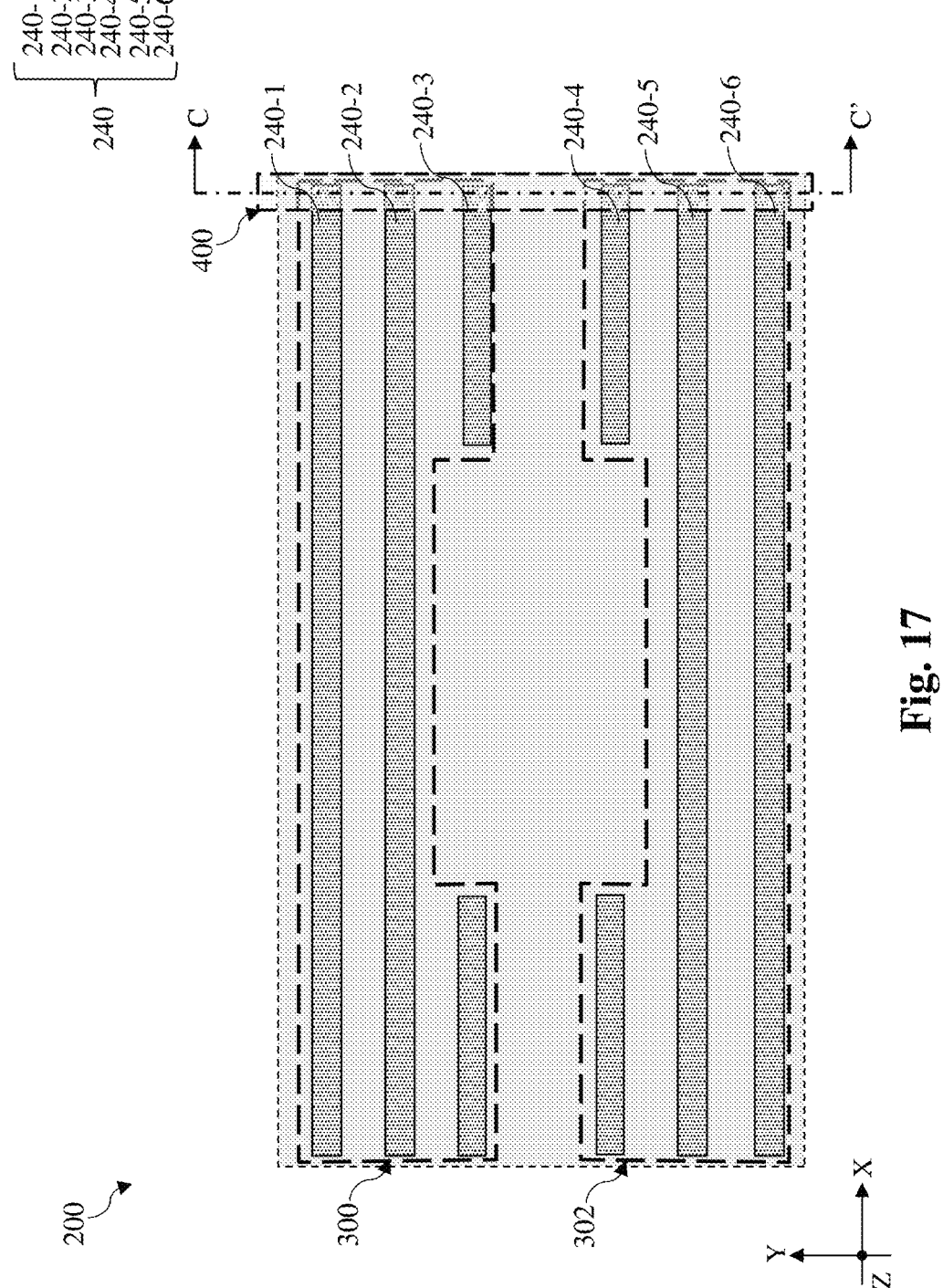
Figure 18:
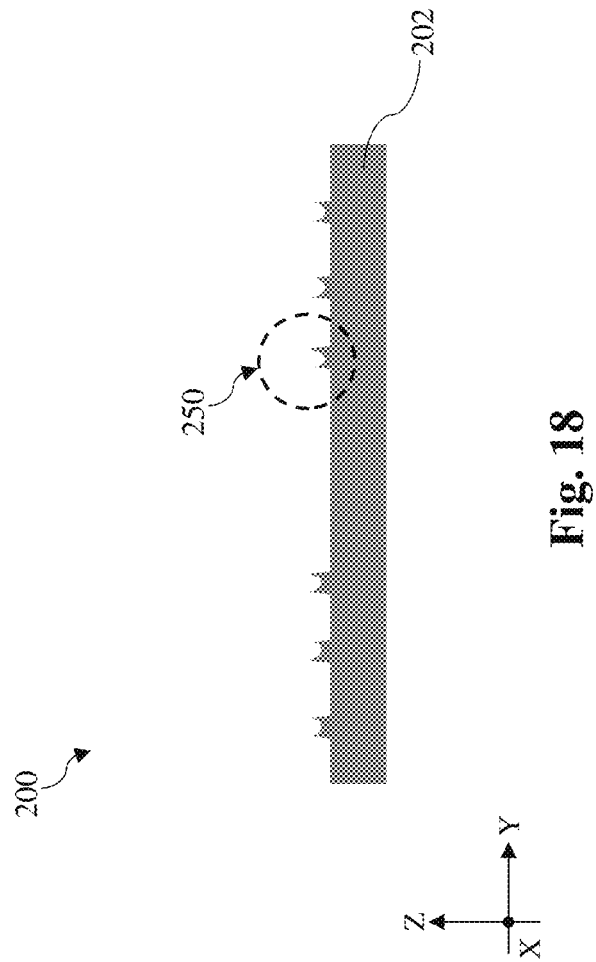

Referring to FIGS. 1, 17 and 18, method 100 includes a block 116 where an optional fin cut process is performed. In some embodiments, a portion of fin elements is removed to cut already formed fin elements into more than one segment. FIG. 17 illustrates a fragmentary top view of the workpiece 200. At block 116, photolithography and etch processes are used to form a fin cut 400. The fin cut 400 is a transverse cut that spans over several fin elements and is performed after the fin elements 240 are formed. In an example process, a bottom layer similar to the first bottom layer 211 is deposited over the fin elements 240 and a patterned photoresist layer is formed over the bottom layer to expose the area of the fin cut 400. Referring to FIG. 18, because the fin cut 400 is performed after formation of the fin elements 240 and the etch process is selective to the fin elements 240, fin residues 250 may be left behind after the fin cut 400 is formed. Similar fin residues 250 are not observed in the field region 245 because no formed fin elements are removed there.

Figure 19:
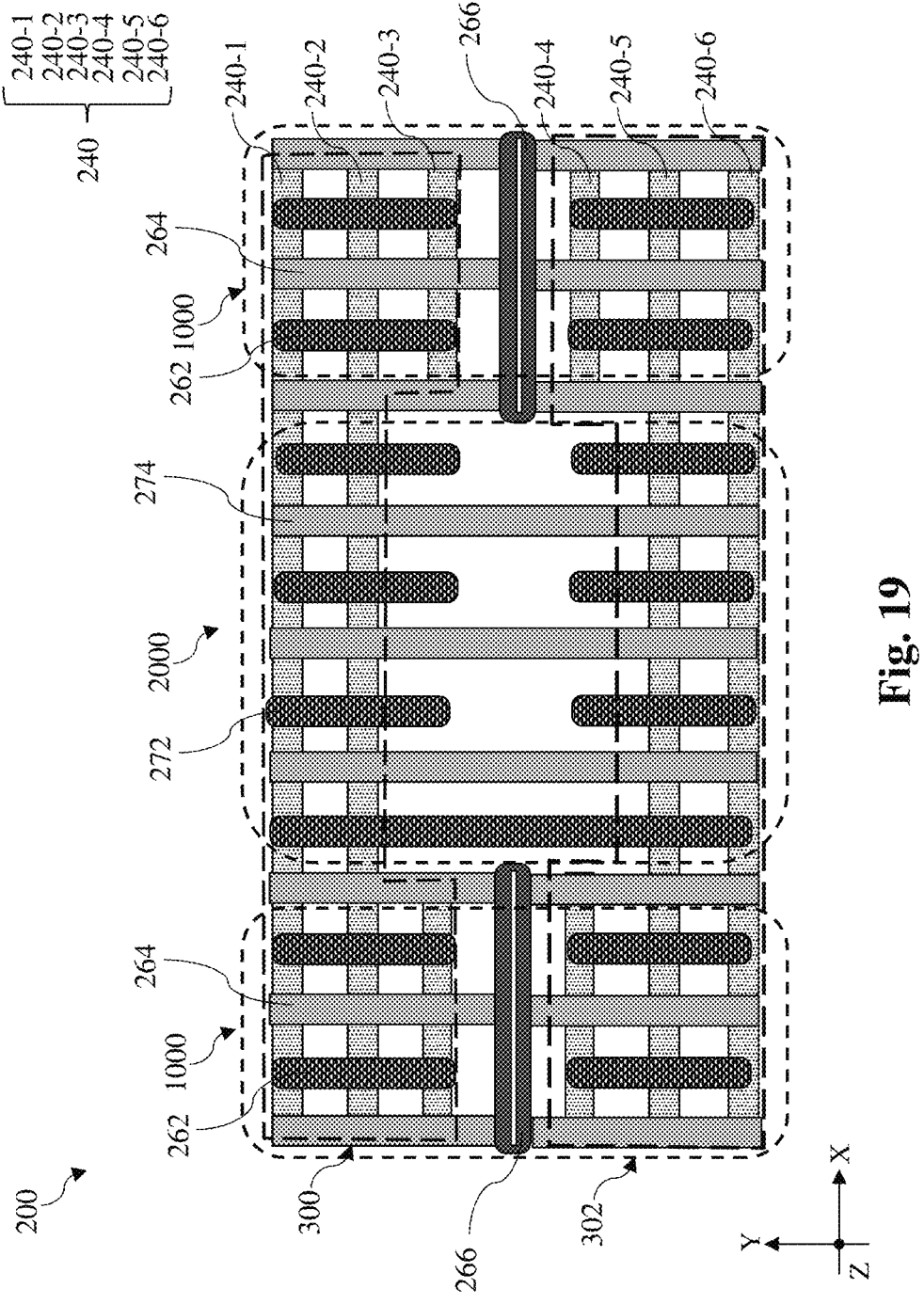
Figure 20:
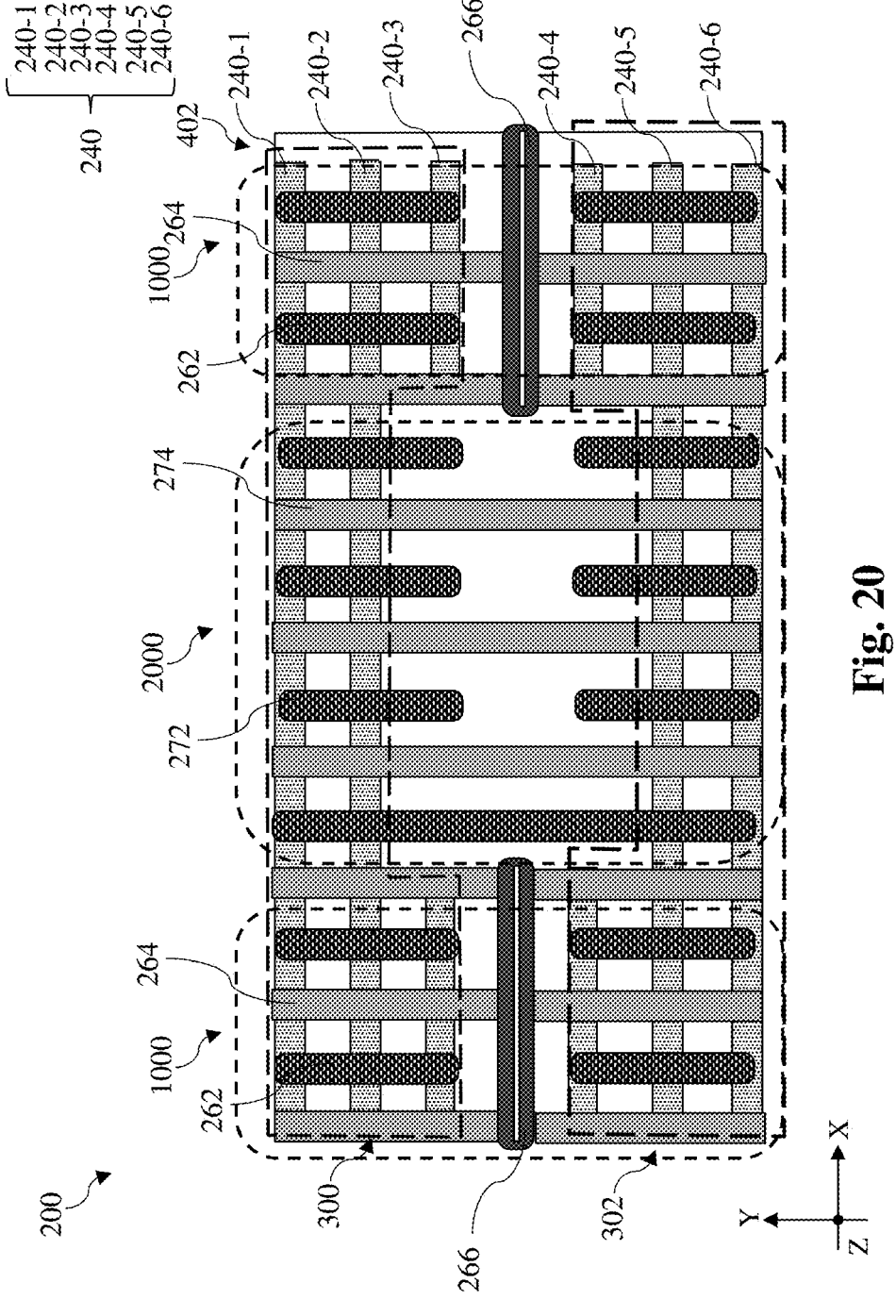

Referring to FIGS. 1, 19 and 20, method 100 includes a block 118 where further processes are performed. Such further processes may include formation of an isolation feature among the fins elements 240, formation of a gate cut feature 266 over the isolation feature, formation of a dummy gate, formation of source/drain features (including first source/drain features 262 and second source/drain features 272), removal of the dummy gate stack, and formation of gate structures (including a plurality of first gate structure 264 and a plurality of second gate structures 274).

The isolation feature is formed over the substrate 202 to isolate the fins elements 240 from one another. In the depicted embodiment, the isolation feature surrounds bottom portions of fin elements 240. The isolation feature may be referred to as a shallow trench isolation (STI) feature. In an example process, a dielectric layer is first deposited over the substrate 202, filling the trenches with the dielectric layer. In some embodiments, the dielectric layer may include silicon oxide, fluorine-doped silicate glass (FSG), a low-k dielectric, combinations thereof, and/or other suitable materials. In various examples, the dielectric layer may be deposited by a CVD process, a subatmospheric CVD (SACVD) process, an FCVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the isolation feature.

Referring still to FIG. 19, the gate cut feature 266 may be formed over the isolation feature to separate gate structure segments. The gate cut feature 266 may include a single layer or multiple layers. In some embodiments, the gate cut feature 266 may include silicon nitride, silicon carbonitride, silicon oxycarbonitride, aluminum oxide, zinc oxide, titanium oxide, zirconium oxide, hafnium oxide, or other suitable metal oxide. The gate cut feature 266 may function to separate a gate structure into segments. Thereafter, a dummy gate stack is deposited over the workpiece 200, including over the fin elements 240, the isolation feature, and the gate cut feature 228. In some embodiments, a gate replacement process (or gate-last process) is adopted where the dummy gate stack serves as a placeholder to undergo various processes and is to be removed and replaced by the functional gate structure. While not explicitly shown, the dummy gate stack may include a dummy gate dielectric layer and a dummy gate electrode over the dummy gate dielectric layer. In some instances, the dummy gate dielectric layer may include silicon oxide. The dummy electrode layer may include polysilicon. While not explicitly shown in the figures, one or more gate spacers may be deposited over sidewalls of the dummy gate stack. After the formation of the one or more gate spacers, the source/drain regions are recessed to form recessed source/drain regions. Source/drain features 262 and 272 may then be formed over the recessed source/drain regions. Source/drain features 262/272 may include silicon (Si) doped with an n-type dopant (e.g. phosphorus (P) or arsenic (As)) or silicon germanium (SiGe) doped with a p-type dopant (e.g. boron (B) or boron difluoride ($BF_2$)). After the formation of source/drain features, a contact etch stop layer (CESL) and an interlayer dielectric (ILD) layer may be sequentially deposited over the workpiece 200.

Referring still to FIG. 19, after the formation of the ILD layer, the dummy gate stack may be removed to expose the fin elements 240 in gate trenches defined by the gate spacers. Gate structures 264 and 274 are then formed in the gate trenches. Each of the gate structures 264 and 274 may include a gate dielectric layer and a gate electrode layer. The gate dielectric layer may include an interfacial layer and a high-k dielectric layer. The interfacial layer may include silicon oxide, hafnium silicate, or silicon oxynitride. The high-K dielectric layer may include hafnium oxide. Alternatively, the high-K dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr) $TiO_3$ (BST), silicon nitride (SiN), silicon oxynitride (SiON), combinations thereof, or other suitable material. The semiconductor structure 200 in FIG. 20 is similar to the semiconductor structure 200 in FIG. 19 but the one in FIG. 20 also includes a fin cut dielectric feature 402 that is formed over the fin cut 400 when operations at block 116 are performed. The fin cut dielectric feature 402 may include silicon oxide, silicon nitride, silicon oxynitride, silicon oxycarbonitride, silicon carbonitride, or a combination thereof.

Reference is again made to FIG. 19. After operations at block 118, three-fin transistors are formed over the three-fin active regions 1000 and two-fin transistors are formed over the two-fin active region 2000. The two-fin active region 2000 is sandwiched between two three-fin active regions 1000. In other words, the two three-fin active regions 1000 abut the two-fin active region 2000 from both sides. A plurality of first gate structures 264 are disposed and wrap over the fin elements in the two three-fin active regions 1000. A plurality of second gate structures 274 are disposed and wrap over the fin elements in the two-fin active region 2000. Each of the plurality of first gate structures 264 terminates at the gate cut feature 266, which extends along the X direction between the first non-rectangular device region 300 and the second non-rectangular device region 302. Each of the plurality of second gate structures 274 extend from fin elements in the first non-rectangular device region 300 to fin elements in the second non-rectangular device region 302. More specifically, each of the plurality of second gate structures 274 is disposed over the first fin element 240-1 and the second fin element 240-2 in the first non-rectangular device region 300 and the fifth fin element 240-5 and the sixth fin element 240-6 in the second non-rectangular device region 302. As shown in FIG. 19, each of the first non-rectangular device region 300 and the second non-rectangular device region 302 is in a telephone receiver shape that includes a rectangular shape and a rectangular cutout. In some embodiments, the semiconductor structure 200 shown in FIG. 19 may be a ring oscillator. In these embodiments, the first non-rectangular device region 300 may include n-type multi-fin transistors and the second non-rectangular device region 302 may include p-type multi-fin transistors. The plurality of second gate structures 274 may serve to interconnect the n-type multi-fin transistor and the p-type multi-fin transistor.

Figure 21:
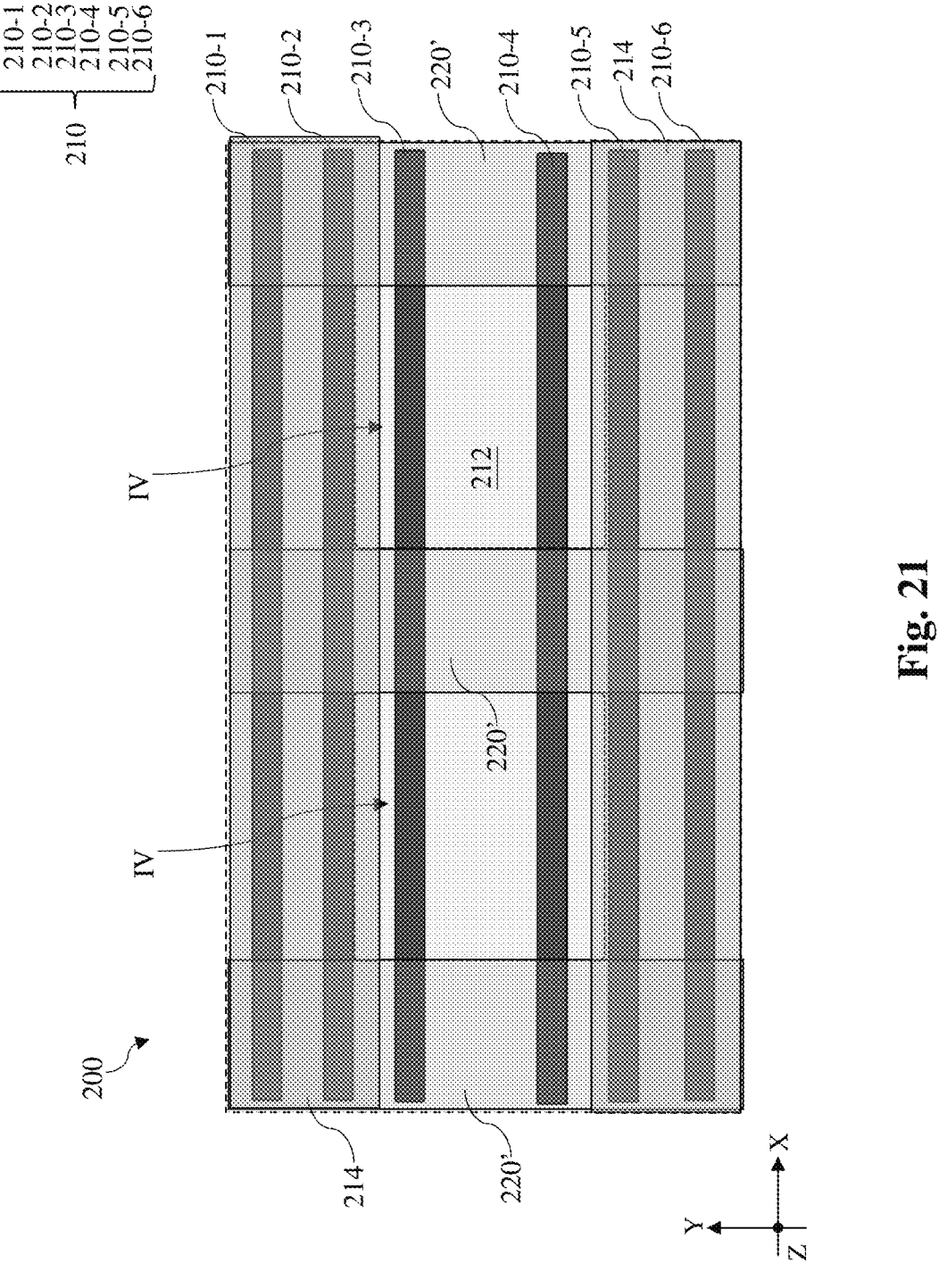
Figure 22:
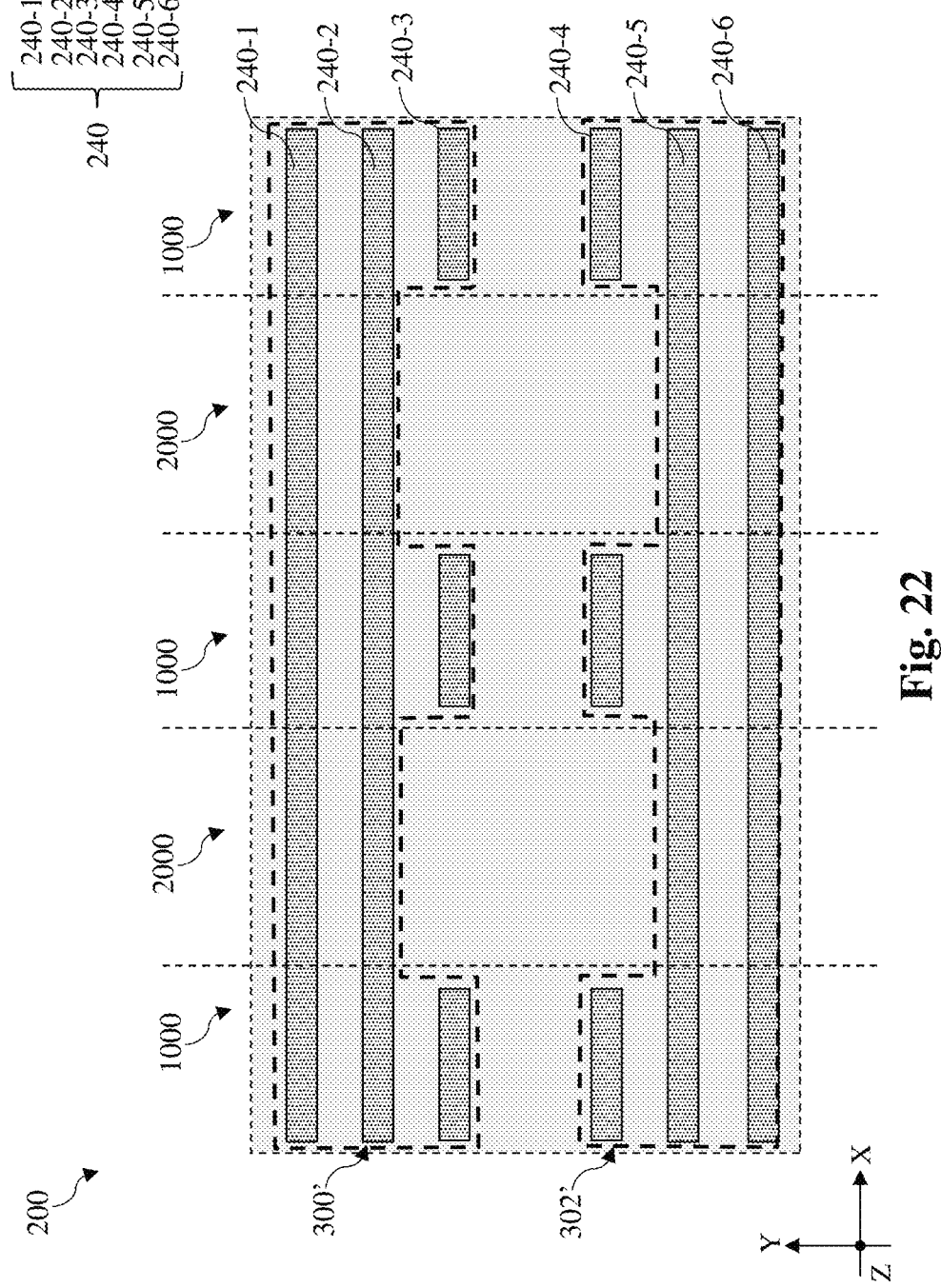

In some alternative embodiments, the non-rectangular device regions may take other shapes based on the patterns of the patterned second photoresist layer formed at block 108. Reference is now made to FIG. 21. In one alternative embodiment, an alternative patterned photoresist layer 220' is formed at block 108. The alternative patterned photoresist layer 220' intersects the patterned fifth hard mask 214 to collectively define two fourth portions IV of the plurality of spacer features 210. The formation of the patterned photoresist layer 220' includes use of two-directional exposure patterns. When this alternative patterned photoresist layer 220' is formed at block 108, the plurality of spacer features 210 and substrate 202 are patterned accordingly at block 110 and 114, resulting in a third non-rectangular device region 300' and a fourth non-rectangular device region 302' shown in FIG. 22. FIG. 22 includes three three-fin active regions 1000 interleaved by two two-fin active regions 2000. Detailed descriptions of the further processes on the workpiece 200 shown in FIG. 22 are omitted for brevity.

Embodiments of the present disclosure provide advantages. For example, methods of the present disclosure form non-rectangular device regions that includes active regions having different numbers of fin elements. This arrangement allows different types of transistors to be placed in close proximity with one another. In an example embodiment, a three-fin active region for high speed or high drive current transistors abuts a two-fin active region for low-consumption transistors.

In one exemplary aspect, the present disclosure is directed to a semiconductor structure. The semiconductor structure includes a first non-rectangular device region. The first non-rectangular device region includes a first region including a first fin, a second fin, and a third fin extending along a first direction and a second region abutting the first region. The second region includes a fourth fin and a fifth fin extending along the first direction. The first fin is aligned with the fourth fin and the second fin is aligned with the fifth fin. The third fin terminates at an interface between the first region and the second region.

In some embodiments, the semiconductor structure further includes a second non-rectangular device region. In some implementations, the second non-rectangular device region is a mirror image of the first non-rectangular device region. In some instances, the first region further includes a first plurality of gate structures extending over the first fin, the second fin, and the third fin along a second direction perpendicular to the first direction and the second region further includes a second plurality of gate structures extending over the fourth fin and the fifth fin along the second direction. In some embodiments, each of the first plurality of gate structures is shorter than each of the second plurality of gate structures. In some instances, the second non-rectangular device region further includes a third region having a sixth fin, a seventh fin, and an eighth fin extending along the first direction, and a fourth region abutting the third region. The fourth region includes a ninth fin and a tenth fin extending along the first direction. In some implementations, the second region further includes a second plurality of gate structures extending over the fourth fin and the fifth fin along a second direction perpendicular to the first direction and the second plurality of gate structures extend over the ninth fin and the tenth fin. In some instances, the semiconductor structure may further include a gate cut feature disposed between the first region and the third region and the third region is a mirror image of the first region with respect to the gate cut feature. In some instances, the first region further includes a first plurality of gate structures extending over the first fin, the second fin, and the third fin along a second direction perpendicular to the first direction. The first plurality of gate structures terminate at the gate cut feature.

In another exemplary aspect, the present disclosure is directed to a semiconductor structure. The semiconductor structure includes a semiconductor substrate, a first two-fin device region over the semiconductor substrate, and a second two-fin device region over the semiconductor substrate. The first two-fin device region includes a first fin and a second fin spaced apart from the first fin by a spacing. The second two-fin device region includes a third fin spaced apart from the second fin by at least four times of the spacing, and a fourth fin spaced apart from the third fin by the spacing. A portion of the semiconductor substrate between the second fin and the third fin is substantially flat.

In some embodiments, the portion of the semiconductor substrate includes no fin residues. In some embodiments, the semiconductor structure may further include a plurality of gate structures that extend and wrap over the first fin, the second fin, the third fin, and the fourth fin. In some implementations, the semiconductor structure may further include a first 3-fin device region abutting the first two-fin device region. The first 3-fin device region includes a fifth fin disposed over the semiconductor substrate and aligned with the first fin, a sixth fin disposed over the semiconductor substrate and aligned with the second fin, and a seventh fin disposed over the semiconductor substrate and spaced apart from the sixth fin by the spacing. In some implementations, the semiconductor structure may further include a second 3-fin device region abutting the second two-fin device region. The second 3-fin device region includes an eighth fin disposed over the semiconductor substrate and aligned with the third fin, a ninth fin disposed over the semiconductor substrate and aligned with the fourth fin, and a tenth fin disposed over the semiconductor substrate and spaced apart from the ninth fin by the spacing. In some instances, the semiconductor structure may further include a gate cut feature disposed between the first 3-fin device region and the second 3-fin device region. In some embodiments, the gate cut feature does not extend between the first two-fin device region and the second two-fin device region.

In yet another exemplary aspect, the present disclosure is directed to a method. The method includes depositing a first hard mask layer over a substrate, depositing a second hard mask layer over the first hard mask layer, forming a plurality of spacers over the second hard mask layer, depositing a bottom layer over the plurality of spacers and the second hard mask layer, depositing a third hard mask layer over the bottom layer, patterning the third hard mask layer to form a patterned third hard mask layer to be disposed directly over a first portion of the plurality of spacers but not a second portion of the plurality of spacers, forming a patterned photoresist layer over the patterned third hard mask, patterning the bottom layer using the patterned third hard mask layer and the patterned photoresist layer as an etch mask such that the patterned bottom layer covers the first portion of the plurality of spacers and the second portion of the plurality of spacers is removed, removing the bottom layer to expose the first portion of the plurality of spacers, and after the removing of the bottom layer, patterning the substrate using the first portion of the plurality of spacers as an etch mask to form a plurality of fin elements.

In some embodiments, the bottom layer completely covers the first portion of the plurality of spacers. In some implementations, the removing of the bottom layer includes a wet clean process. In some instances, the method may further include after the patterning of the substrate, selectively removing a portion of the plurality of fin elements.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first non-rectangular device region that includes:
      a first region comprising a first fin, a second fin, and a third fin extending along a first direction,
      a second region abutting the first region, the second region comprising a fourth fin and a fifth fin extending along the first direction, and
      a first plurality of gate structures extending over the first fin, the second fin and the third fin along a second direction perpendicular to the first direction; and
   a second non-rectangular device region that includes:
      a third region comprising a sixth fin, a seventh fin, and an eighth fin extending along the first direction,
      a fourth region comprising a ninth fin and a tenth fin extending along the first direction, and
      a second plurality of gate structures extending over the sixth fin, the seventh fin, and the eighth fin along the second direction,
   wherein the first fin is aligned with the fourth fin and the second fin is aligned with the fifth fin,
   wherein the third fin terminates at an interface between the first region and the second region,
   wherein each of the first plurality of gate structures and each of the second plurality of gate structures terminate at and are in contact with a gate cut dielectric feature extending along the second direction.

2. The semiconductor structure of claim 1, wherein the second non-rectangular device region is a mirror image of the first non-rectangular device region with respect to a line passing over the gate cut dielectric feature.

3. The semiconductor structure of claim 1, wherein the second region further comprises a third plurality of gate structures extending over the fourth fin and the fifth fin along the second direction.

4. The semiconductor structure of claim 3, wherein each of the first plurality of gate structures is shorter than each of the third plurality of gate structures.

5. The semiconductor structure of claim 3, wherein the third plurality of gate structures extend over the ninth fin and the tenth fin in the fourth region.

6. The semiconductor structure of claim 1, wherein the gate cut dielectric feature comprises silicon nitride, silicon carbonitride, silicon oxycarbonitride, aluminum oxide, zinc oxide, titanium oxide, zirconium oxide, or hafnium oxide.

7. The semiconductor structure of claim 5, wherein the gate cut dielectric feature extends along the first direction toward the third plurality of gate structures.

8. The semiconductor structure of claim 5, further comprising:

a source/drain feature extending continuously over the fourth fin, the fifth fin, the ninth fin, and the tenth fin.

9. The semiconductor structure of claim 8, wherein the gate cut dielectric feature extends along the first direction toward a sidewall of the source/drain feature.

10. A semiconductor structure, comprising:

a semiconductor substrate;

a first two-fin device region over the semiconductor substrate, the first two-fin device region comprising:

a first fin, and a second fin spaced apart from the first fin by a spacing;

a second two-fin device region over the semiconductor substrate, the second two-fin device region comprising:

a third fin spaced apart from the second fin by at least four times of the spacing, and a fourth fin spaced apart from the third fin by the spacing;

a first 3-fin device region abutting the first two-fin device region, the first 3-fin device region comprising:

a fifth fin disposed over the semiconductor substrate and aligned with the first fin, a sixth fin disposed over the semiconductor substrate and aligned with the second fin, a seventh fin disposed over the semiconductor substrate and spaced apart from the sixth fin by the spacing, and a first plurality of gate structures wrapping over the fifth fin, the sixth fin, and the seventh fin;

a second 3-fin device region abutting the second two-fin device region, the second 3-fin device region comprising:

an eighth fin disposed over the semiconductor substrate and aligned with the third fin, a ninth fin disposed over the semiconductor substrate and aligned with the fourth fin, a tenth fin disposed over the semiconductor substrate and spaced apart from the ninth fin by the spacing, and a second plurality of gate structures wrapping over the eighth fin, the ninth fin, and the tenth fin; and a gate cut feature disposed between the first 3-fin device region and the second 3-fin device region, wherein a portion of the semiconductor substrate between the second fin and the third fin is substantially flat, wherein each of the first plurality of gate structures and each of the second plurality of gate structures terminate at and are in contact with the gate cut feature.

11. The semiconductor structure of claim 10, wherein the portion of the semiconductor substrate comprises no fin residues.

12. The semiconductor structure of claim 10, further comprising:

a plurality of gate structures that extend and wrap over the first fin, the second fin, the third fin, and the fourth fin.

13. The semiconductor structure of claim 10, wherein the gate cut feature does not extend between the first two-fin device region and the second two-fin device region.

14. The semiconductor structure of claim 10, wherein the gate cut feature comprises silicon nitride, silicon carbonitride, silicon oxycarbonitride, aluminum oxide, zinc oxide, titanium oxide, zirconium oxide, or hafnium oxide.

15. The semiconductor structure of claim 10, wherein the tenth fin and the seventh fin are spaced apart by a group spacing greater than the spacing.

16. The semiconductor structure of claim 15, wherein the group spacing is at least 4 times of the spacing.

17. A semiconductor structure, comprising:

a first three-fin active region comprising:

a first fin, a second fin, and a third fin extending lengthwise along a first direction, and a first plurality of gate structures extending lengthwise along a second direction perpendicular to the first direction to engage the first fin, the second fin and the third fin;

a second three-fin active region comprising a fourth fin, a fifth fin, and a sixth fin extending lengthwise along the first direction, and a second plurality of gate structures extending lengthwise along the second direction to engage the fourth fin, the fifth fin and the sixth fin;

a gate cut feature extending lengthwise along the first direction and in contact with each of the first plurality of gate structures and each of the second plurality of gate structures; and a first two-fin active region abutting the first three-fin active region along the first direction and comprising:

a seventh fin and an eighth fin extending lengthwise along the first direction, and a third gate structure extending along the second direction to engage the seventh fin and the eighth fin, wherein the first fin and the seventh fin are aligned along the first direction, wherein the second fin and the eighth fin are aligned along the first direction.

18. The semiconductor structure of claim 17, wherein the third fin terminates at an interface between the first three-fin active region and the first two-fin active region.

19. The semiconductor structure of claim 17, wherein the gate cut feature is disposed between the first three-fin active region and the second three-fin active region along the second direction, wherein the gate cut feature extends toward a sidewall of the third gate structure.

20. The semiconductor structure of claim 19, further comprising:

a second two-fin active region spaced apart from the first two-fin active region along the second direction and comprising a ninth fin and a tenth fin extending lengthwise along the first direction, wherein the third gate structure extends along the second direction to engage the ninth fin and the tenth fin.

* * * * *